US012593447B2

(12) United States Patent
Hopkins

(10) Patent No.: US 12,593,447 B2
(45) Date of Patent: Mar. 31, 2026

(54) ELECTRONIC DEVICES COMPRISING AN OXIDE FILL REGION, AND RELATED ELECTRONIC SYSTEMS AND METHODS

(71) Applicant: Micron Technology, Inc., Boise, ID (US)

(72) Inventor: John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 708 days.

(21) Appl. No.: 17/813,818

(22) Filed: Jul. 20, 2022

(65) Prior Publication Data

US 2024/0032294 A1 Jan. 25, 2024

(51) Int. Cl.
| | |
|---|---|
| *H10B 43/27* | (2023.01) |
| *H10B 41/10* | (2023.01) |
| *H10B 41/27* | (2023.01) |
| *H10B 43/10* | (2023.01) |

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ........ H10B 41/10; H10B 41/27; H10B 43/10; H10B 43/27
See application file for complete search history.

(56) References Cited

U.S. PATENT DOCUMENTS

| | | | |
|---|---|---|---|
| 9,741,737 B1 | 8/2017 | Huang et al. | |
| 11,737,273 B2 | 8/2023 | Nam et al. | |
| 11,839,074 B2 | 12/2023 | Heo | |
| 2005/0082601 A1 | 4/2005 | Chu et al. | |
| 2017/0162594 A1 | 6/2017 | Ahn | |
| 2017/0256551 A1 | 9/2017 | Lee | |
| 2017/0338241 A1 | 11/2017 | Lee | |
| 2018/0122906 A1 | 5/2018 | Yu et al. | |
| 2018/0261671 A1 | 9/2018 | Matsumoto et al. | |
| 2019/0244970 A1 | 8/2019 | Jung et al. | |
| 2019/0273088 A1 | 9/2019 | Cui et al. | |
| 2019/0333931 A1 | 10/2019 | Jung et al. | |
| 2020/0388634 A1 | 12/2020 | Jung et al. | |
| 2021/0036001 A1 | 2/2021 | Kim et al. | |
| 2021/0143167 A1 | 5/2021 | Howder et al. | |

(Continued)

OTHER PUBLICATIONS

Hopkins et al., Integrated Assemblies, and Methods of Forming Integrated Assemblies, filed Dec. 18, 2020, U.S. Appl. No. 17/126,777, 66 pages.

(Continued)

*Primary Examiner* — Fernando L Toledo
*Assistant Examiner* — Ryan T. Fortin
(74) *Attorney, Agent, or Firm* — TraskBritt

(57) ABSTRACT

An electronic device comprising a source stack comprising one or more conductive materials, and an oxide fill region within an upper portion of the source stack. A source contact is adjacent to the source stack and the oxide fill region, and a doped semiconductive material is adjacent to the source contact. Tiers of alternating conductive materials and dielectric materials are adjacent to the doped semiconductive material, and pillars extend through the tiers, the doped semiconductive material, and the source contact and into the source stack. Additional electronic devices are also disclosed, as are related methods and electronic systems.

22 Claims, 22 Drawing Sheets

(56) References Cited

U.S. PATENT DOCUMENTS

| | | | |
|---|---|---|---|
| 2021/0257387 A1 | 8/2021 | Huang et al. | |
| 2021/0358929 A1* | 11/2021 | Hopkins | H10B 43/27 |
| 2021/0358938 A1 | 11/2021 | Hopkins | |
| 2021/0358939 A1 | 11/2021 | Hopkins et al. | |
| 2021/0375903 A1 | 12/2021 | Hopkins | |
| 2021/0376083 A1 | 12/2021 | Greenlee et al. | |
| 2021/0384208 A1 | 12/2021 | Hopkins et al. | |
| 2021/0384216 A1 | 12/2021 | Greenlee et al. | |
| 2022/0068965 A1* | 3/2022 | Chandolu | H10B 41/27 |
| 2022/0149067 A1* | 5/2022 | Hopkins | H10B 43/35 |

OTHER PUBLICATIONS

Hopkins et al., Methods of Forming Microelectronic Devices, and Related Microelectronic Devices, and Electronic Systems, filed Sep. 4, 2020, U.S. Appl. No. 17/012,741, 56 pages.

Hopkins et al., Microelectronic Devices Including Cap Structures, and Related Electronic Systems and Methods, filed Dec. 27, 2021, U.S. Appl. No. 63/266,027, 71 pages.

Howder et al., Microelectronic Devices Including Filled Slits and Memory Cell Pillars, and Related Memory Devices, Electronic Systems, and Methods, filed Apr. 16, 2021, U.S. Appl. No. 17/233,158, 46 pages.

Lindemann et al., Electronic Devices Comprising a Dielectric Material, and Related Systems and Methods, filed Jan. 26, 2021, U.S. Appl. No. 17/158,918, 55 pages.

Liu et al., Microelectronic Devices With Vertically Recessed Channel Structures and Discrete, Spaced Inter-Slit Structures, and Related Methods and Systems, filed Jan. 26, 2021, U.S. Appl. No. 17/158,888, 92 pages.

* cited by examiner

ELECTRONIC DEVICES COMPRISING AN OXIDE FILL REGION, AND RELATED ELECTRONIC SYSTEMS AND METHODS

CROSS-REFERENCE TO RELATED APPLICATIONS

The subject matter of this application is related to the subject matter of U.S. patent application Ser. No. 17/813,795, titled "ELECTRONIC DEVICES COMPRISING A SOURCE IMPLANT REGION, AND RELATED ELECTRONIC SYSTEMS AND METHODS," and U.S. patent application Ser. No. 17/813,847, titled "ELECTRONIC DEVICES INCLUDING AN IMPLANT STRUCTURE, AND RELATED SYSTEMS AND METHODS," each of which was filed on Jul. 20, 2022, the same date as this application.

TECHNICAL FIELD

Embodiments of the disclosure relate to the field of electronic device design and fabrication. More particularly, the disclosure relates to electronic devices having an oxide fill region above or below a source contact, and to related electronic systems and methods for forming the electronic devices.

BACKGROUND

Memory devices provide data storage for electronic systems. A Flash memory device is one of various memory type and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional (3D) NAND memory device, not only are the memory cells arranged in rows and columns in a horizontal array, but tiers of the horizontal arrays are stacked over one another (e.g., as vertical strings of memory cells) to provide a 3D array of the memory cells. The stack of tiers vertically alternate conductive materials with dielectric materials, with the conductive materials functioning as access lines (e.g., word lines) and gate structures (e.g., control gates) for the memory cells. Pillars comprising channels and tunneling structures extend along and form portions of the memory cells of individual vertical strings of memory cells. A drain end of a string is adjacent one of the top or bottom of the pillar, while a source end of the string is adjacent the other of the top or bottom of the pillar. The drain end is operably connected to a bit line, and the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

In conventional 3D NAND memory devices, the pillars including the channels are formed through multiple polysilicon materials, and contact between the channels and other electrically conductive components of the memory devices is achieved by a laterally-oriented, doped polysilicon material. However, etching the multiple polysilicon materials may cause processing challenges, such as over-etching. The over-etching may, for example, lead to corrosion of conductive materials of the source stack.

DETAILED DESCRIPTION

Figure 1:
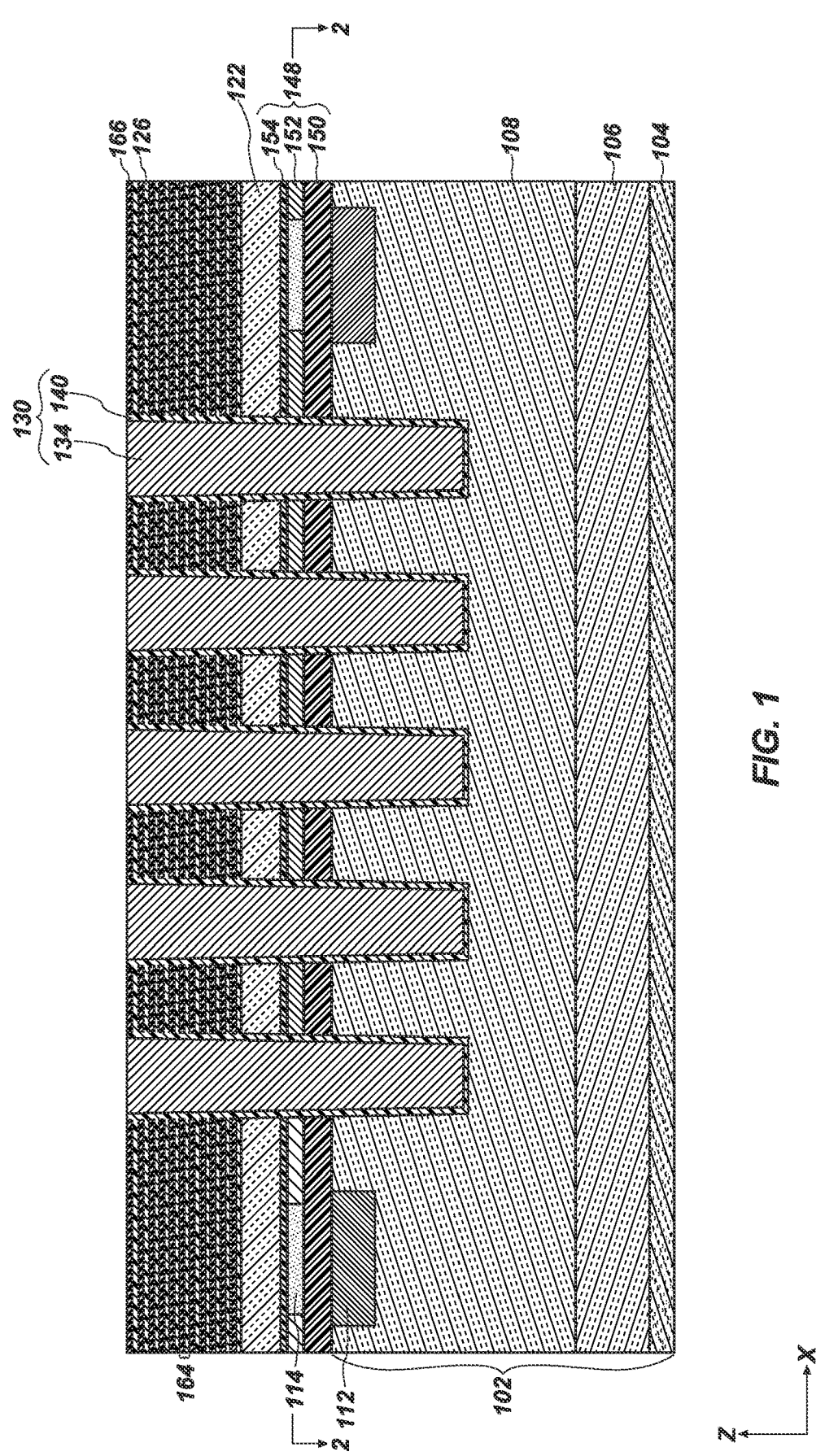
FIGS. 1, 3, and 5-8 are partial cross-sectional views illustrating a method of forming electronic devices in accordance with embodiments of the disclosure.

Electronic devices (e.g., apparatus, electronic devices) and systems (e.g., electronic systems) according to embodiments of the disclosure include an oxide fill region that may be above or below a lower region of a slit that is used to form a lateral contact (e.g., a source contact) to a channel of pillars of the electronic devices. The oxide fill region provides additional process margin for removing (e.g., etching) materials of the electronic device and into a source contact region while protecting a source stack below the source contact region. By including the oxide fill region in the source stack of the electronic device below the source contact or in a doped semiconductive material of the electronic device above the source contact, etching into and through the source contact may be minimized. The oxide fill region protects underlying conductive materials of the source stack, and improves sidewall etching into the source contact region. By appropriately selecting a material of the oxide fill region, polysilicon materials of the electronic device may be selectively removed without exposing portions of the source stack beneath the oxide fill region to the removal condition. By protecting the source stack with the oxide fill region, corrosion of conductive materials of the source stack is reduced or eliminated.

Fabrication of the electronic device includes forming and removing multiple sacrificial structures during the formation of the source contact in the source contact region. A source contact sacrificial structure is used to form the source contact in a desired location and a slit is formed through the source contact sacrificial structure to expose the source stack. An oxide fill material formed in a desired location may enable the slit to be formed while protecting the source stack from over etching. The oxide fill region may be located above the source contact region, or below the source contact region. Material selection for the oxide fill region may be selected to allow for etch selectivity during the fabrication of the electronic device. A dimension (e.g., a width) of the oxide fill region in a lateral direction is greater than or equal to a width of a lower portion of the slit. Therefore, portions of the source contact material may be laterally etched without etching portions of the source stack underlying the source contact. In contrast to conventional electronic devices, the electronic devices according to some embodiments of the disclosure include the oxide fill region in an upper portion of the source stack and below a fill material subsequently formed in the slit. Additionally, in contrast to conventional electronic devices, the electronic devices according to other embodiments of the disclosure include the oxide fill region within a doped dielectric region, laterally adjacent to the fill material subsequently formed in the slit.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), epitaxial growth, or ion implanting (e.g., plasma doping ion implantation). Alternatively, the materials may be grown in situ. Depending on the specific material to be formed, the technique for depositing or growing the material may be selected by a person of ordinary skill in the art unless the context indicates otherwise. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "conductive material" means and includes an electrically conductive material. The conductive material may include, but is not limited to, one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon, where x, y, or z are integers or non-integers.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operably connected with each other, such as electrically connected through a direct ohmic connection or through an indirect connection (e.g., via another structure).

As used herein, the term "dielectric material" means and includes an electrically insulative material. The dielectric material may include, but is not limited to, one or more of an insulative oxide material, an insulative nitride material, an insulative oxynitride material, an insulative carboxynitride material, and/or air. A dielectric oxide material may be an oxide material, a metal oxide material, or a combination thereof. The dielectric oxide material may include, but is not limited to, a silicon oxide ($SiO_x$, silicon dioxide ($SiO_2$)), phosphosilicate glass (PSG), borosilicate glass (BSG), borophosphosilicate glass (BPSG), fluorosilicate glass (FSG), aluminum oxide ($AlO_x$), barium oxide, gadolinium oxide ($GdO_x$), hafnium oxide ($HfO_x$), magnesium oxide ($MgO_x$), molybdenum oxide, niobium oxide ($NbO_x$), strontium oxide, tantalum oxide ($TaO_x$), titanium oxide ($TiO_x$), yttrium oxide, zirconium oxide ($ZrO_x$), hafnium silicate, a dielectric oxynitride material (e.g., $SiO_xN_y$), a dielectric carbon nitride material (SiCN), a dielectric carboxynitride material (e.g., $SiO_xC_zN_y$), a combination thereof, or a combination of one or more of the listed materials with silicon oxide, where values of "x," "y," and "z" may be integers or may be non-integers. A dielectric nitride material may include, but is not limited to, silicon nitride. A dielectric oxynitride material may include, but is not limited to, a silicon oxynitride ($SiO_xN_y$). A dielectric carboxynitride material may include, but is not limited to, a silicon carboxynitride ($SiO_xC_zN_y$). The dielectric material may be a stoichiometric compound or a non-stoichiometric compound.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "high-k dielectric material" means and includes a dielectric oxide material having a dielectric constant greater than the dielectric constant of silicon oxide ($SiO_x$), such as silicon dioxide ($SiO_2$). The dielectric constant of silicon dioxide is from about 3.7 to about 3.9. The high-k dielectric material may include, but is not limited to, a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide. The term "high-k dielectric material" is a relative term and is distinguished from the term "dielectric material" by a relative value of its dielectric constant. Materials listed above as examples of a "dielectric material" may overlap with some of the materials listed above as examples of a "high-k dielectric material" since the terms are relative.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the terms "opening" and "slit" mean and include a volume extending through at least one structure or at least one material, leaving a void (e.g., gap) in the at least one structure or at least one material, or a volume extending between structures or materials, leaving a gap between the structures or materials. Unless otherwise described, the opening and/or slit is not necessarily empty of material. That is, an opening and/or slit is not necessarily void space. An opening and/or slit formed in or between structures or materials may comprise structure(s) or material(s) other than that in or between which the opening and/or slit is formed. And, structure(s) or material(s) "exposed" within an opening and/or slit is (are) not necessarily in contact with an atmosphere or non-solid environment. Structure(s) or material(s) exposed within an opening and/or slit may be adjacent or in contact with other structure(s) or material(s) that is (are) disposed within the opening and/or slit.

As used herein, the term "sacrificial," when used in reference to a material or a structure, means and includes a material or structure that is formed during a fabrication process but at least a portion of which is removed (e.g., substantially removed) prior to completion of the fabrication process. The sacrificial material or sacrificial structure may be present in some portions of the electronic device and absent in other portions of the electronic device.

As used herein, the terms "selectively removable" or "selectively etchable" mean and include a material that exhibits a greater etch rate responsive to exposure to a given etch chemistry and/or process conditions (collectively referred to as etch conditions) relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and process conditions for selectively removing (e.g., selectively etching) a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials or components, such as those within memory cells, are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Furthermore, when reference is made to a "substrate" or "base material" in the following description, previous process acts may have been conducted to form materials or structures in or on the substrate or base material.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

FIGS. 1 through 10 are simplified, partial cross sectional and partial top-down perspective views illustrating processing stages of a method of forming an electronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form an electronic device.

Figure 2:
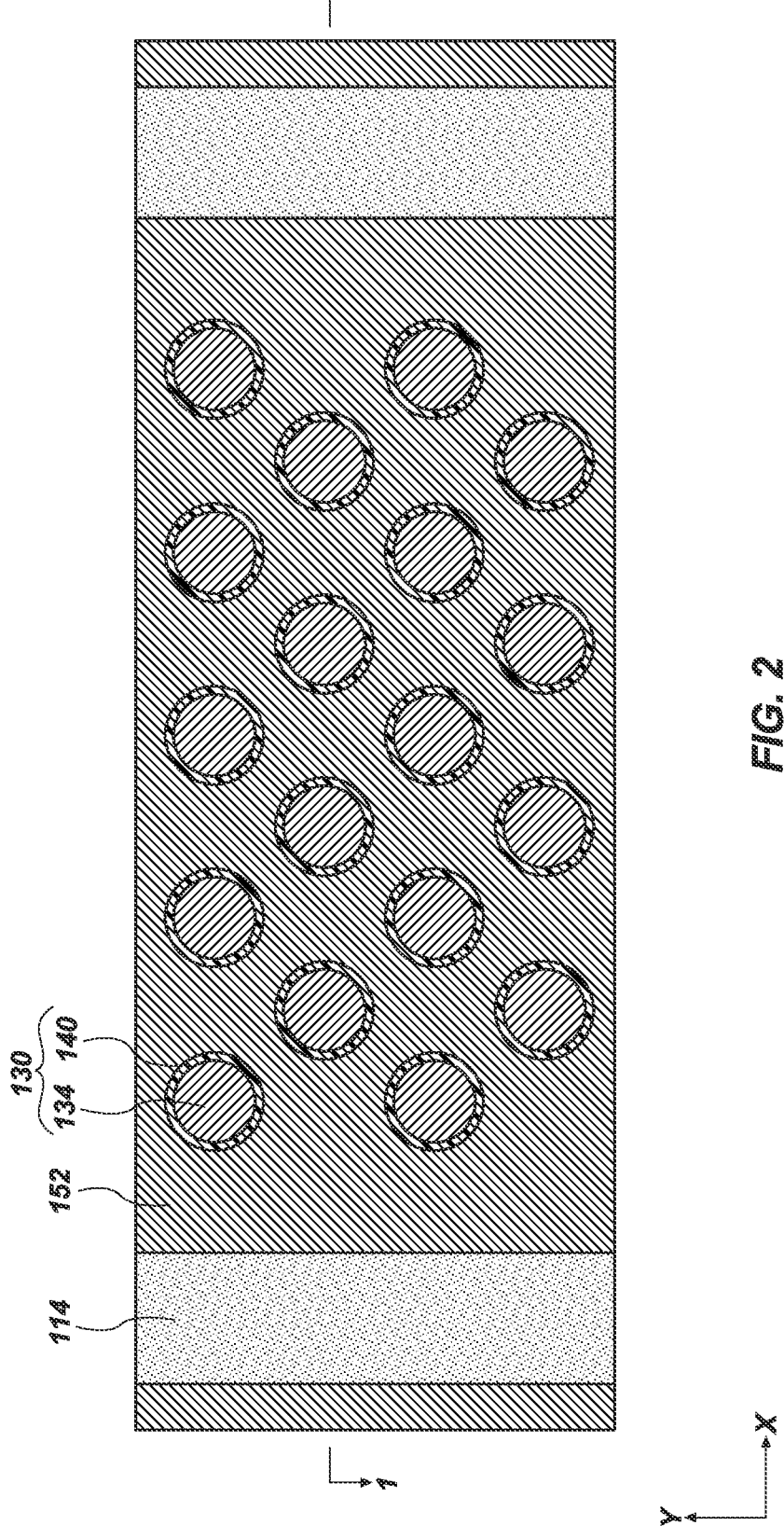
FIGS. 2, and 4 are partial top-down views illustrating a method of forming electronic devices in accordance with embodiments of the disclosure.

FIG. 1 is a partial cross-sectional schematic illustration taken through the line 1-1 in FIG. 2, and FIG. 2 is a partial cross-sectional top-down schematic illustration taken through the line 2-2 in FIG. 1. As shown in FIG. 1, a source stack 102 is formed adjacent to a base material (not shown) and includes one or more conductive materials, with a conductive liner material 104 formed adjacent to the base material, a source material 106 formed adjacent to the conductive liner material 104, and a semiconductive material 108 formed adjacent to the source material 106. In some embodiments, the conductive liner material 104 is formed of and includes titanium nitride, the source material 106 is formed of and includes tungsten silicide ($WSi_x$), and the semiconductive material 108 is formed of and includes a doped polysilicon material. However, the conductive liner material 104, the source material 106, and the semiconductive material 108 may be formed of and include other conductive materials. Each of the conductive liner material 104, source material 106, and semiconductive material 108 may be formed by conventional techniques and to a desired thickness. By way of example only, the conductive liner material 104 may be formed to a thickness of from about 200 Å to about 400 Å, the source material 106 may be formed to a thickness of from about 800 Å to about 1000 Å, and the semiconductive material 108 may be formed to a thickness of from about 2000 Å to about 4000 Å.

An oxide fill region 112 is present within the source stack 102, such as within an upper portion of the source stack 102. The oxide fill region 112 may, for example, be in an upper portion of the semiconductive material 108. To form the oxide fill region 112, a mask may be formed on the semiconductive material 108 and patterned by conventional photolithography techniques. A recess in the patterned mask may be transferred into the upper portion of the semiconductive material 108. The recess may terminate within the upper portion of the semiconductive material 108 of the source stack 102. An oxide fill material may be formed (e.g., deposited) into the recess to form the oxide fill region 112 within the semiconductive material 108. The oxide fill region 112 may be formed (e.g., deposited) by any suitable technique, such as by a conformal deposition process. The oxide fill region 112 may include one or more of the insulative oxide materials described herein. For example, the oxide fill material may include silicon oxide ($SiO_x$). By way of example, a conformal oxide material may be deposited within the recess in the semiconductive material 108. Portions of the oxide fill material (e.g., portions extending above the recess and over the semiconductive material 108) may be removed via conventional methods (e.g., a directional etch) to define the oxide fill region 112.

A source contact sacrificial structure 148 is formed over the source stack 102, as shown in FIG. 1. The source contact sacrificial structure 148 may include a first sacrificial material 150, a second sacrificial material 152, and a third sacrificial material 154, each of which is formed by conventional techniques. Materials of the first sacrificial material 150, the second sacrificial material 152, and the third sacrificial material 154 may be selectively removable (e.g., selectively etchable) relative to one another and relative to other materials. However, the first sacrificial material 150 and the third sacrificial material 154 may be the same material (e.g., the same chemical composition) or may be a different material (e.g., a different chemical composition). By way of example only, the first sacrificial material 150, the second sacrificial material 152, and the third sacrificial material 154 may be dielectric materials, such as a silicon oxide material or a silicon nitride material. In some embodiments, the first sacrificial material 150 is a highly conformal silicon dioxide, the second sacrificial material 152 is silicon nitride, and the third sacrificial material 154 is tetraethylorthosilicate (TEOS). However, other combinations of selectively etchable dielectric materials may be used. In addition, the source contact sacrificial structure 148 may be formed of and include two materials or more than three materials.

Removal of the source contact sacrificial structure 148 provides lateral access for the subsequently-formed source contact 120 (see FIGS. 9 and 10) to contact pillars 130, electrically coupling the source contact 120 to the pillars 130. The location of the source contact sacrificial structure 148, therefore, corresponds to the location at which the source contact 120 is ultimately formed, and a total thickness of the as-formed source contact sacrificial structure 148 may be determined by a desired thickness of the source contact 120. Individual thicknesses of each of the first sacrificial material 150, the second sacrificial material 152, and the third sacrificial material 154 may be selected based on the desired thickness of the source contact 120. By way of example only, the first sacrificial material 150 may be formed to a thickness of from about 30 Å to about 400 Å, the second sacrificial material 152 may be formed to a thickness of from about 100 Å to about 300 Å, and the third sacrificial material 154 may be formed to a thickness of from about 30 Å to about 200 Å. The thickness of each of the first sacrificial material 150, the second sacrificial material 152, and the third sacrificial material 154 may be sufficient to protect the pillars 130 and the source stack 102 during subsequently conducted process acts that provide access to the pillars 130 by sequentially removing portions of materials of the pillars 130.

A slit sacrificial structure 114 is formed in the second sacrificial material 152, as shown in FIGS. 1 and 2. The slit sacrificial structure 114 may be formed of and include one or more materials that are selectively etchable relative to the materials of the third sacrificial material 154, and any materials subsequently formed adjacent to (e.g., above) the slit sacrificial structure 114. The slit sacrificial structure 114 may also function as an etch stop during subsequent process acts. The slit sacrificial structure 114 may extend through the second sacrificial material 152 and, optionally, partially into the first sacrificial material 150 of the source contact sacrificial structure 148. The slit sacrificial structure 114 is formed vertically adjacent to (e.g., above) the oxide fill region 112. Additionally, the slit sacrificial structure 114 has a lateral width configured to be less than the lateral width $W_1$ (see FIG. 9) of the oxide fill region 112. A location of the slit sacrificial structure 114 corresponds to a location adjacent to which (e.g., over which) a slit 170 (see FIGS. 3 and 4) is subsequently formed. The slit sacrificial structure 114 may be formed of a single material, two materials, or more than three materials as long as the material(s) provide the desired etch selectivity and etch stop functions. By way of example only, the slit sacrificial structure 114 may be tungsten, a tungsten containing material, or aluminum oxide. Alternatively, the slit sacrificial structure 114 may, for example, include a dielectric material, a liner, and a etch stop material. By way of example only, the dielectric material may be a silicon oxide material, the liner may be a titanium nitride material, and the etch stop material may be tungsten or a tungsten-containing material. The etch stop material may be configured as a plug. Alternatively, the slit sacrificial structure 114 may be formed of a single material, such as aluminum oxide, two materials, or more than three materials as long as the material(s) provide the desired etch selectivity and etch stop functions. The thickness of the slit sacrificial structure 114 and the second sacrificial material 152 may be substantially the same, such that upper surfaces and lower surfaces of the slit sacrificial structure 114 and the second sacrificial material 152 are substantially coplanar.

The slit sacrificial structure 114 may extend laterally, with the second sacrificial material 152 positioned on each side of the slit sacrificial structure 114 as shown in FIG. 2. The slit sacrificial structure 114 may extend continuously in the y direction. Similarly, the oxide fill region 112 may extend laterally, with the upper portion of the semiconductive material 108 positioned on each side of the slit sacrificial structure 114. As shown in FIG. 1, the slit sacrificial structure 114 and the oxide fill region 112 extend parallel to one another. The Features subsequently formed above the slit sacrificial structure 114 and the oxide fill region 112 may also extend laterally in a similar manner.

A doped semiconductive material 122 is formed adjacent to the source contact sacrificial structure 148 by conventional techniques. The doped semiconductive material 122 may be resistant to etch conditions (e.g., etch chemistries and process conditions) used during subsequent process acts, such as to etch conditions used to remove polysilicon-based materials. By way of example only, the doped semiconductive material 122 may be resistant to phosphoric acid-based etch chemistries, to TMAH, to ammonium hydroxide, to hydrogen fluoride (HF), or to other halogen-based etch chemistries.

The doped semiconductive material 122 may be a doped silicon nitride material or a doped silicon oxide (e.g., silicon dioxide) material. By way of example only, the doped semiconductive material 122 may be a carbon-doped semiconductive material, such as a carbon-doped silicon nitride material, a carbon-doped silicon material, or a carbon-doped silicon oxynitride material. In some embodiments, the doped semiconductive material 122 is carbon-doped silicon. Alternatively, the doped semiconductive material may be a boron-doped semiconductive material, such as a boron-doped silicon nitride material, a boron-doped silicon material, or a boron-doped silicon oxynitride material. The dopant in the semiconductive material may be present at a concentration sufficient to provide the desired etch selectivity without providing conductivity to the semiconductive material. The dopant concentration may be tailored to achieve the desired etch selectivity of the doped semiconductive material 122. The dopant may be present in the semiconductive material at a concentration of from about 1% by weight to about 12% by weight. While embodiments herein describe the semiconductive material between the source contact 120 and tiers 164 as being a doped semiconductive material, a high-k dielectric material that exhibits the desired etch selectivity may, alternatively, be used. The high-k dielectric material may include, but is not limited to, hafnium oxide ($HfO_x$), aluminum oxide ($AlO_x$), antimony oxide ($SbO_x$), cerium oxide ($CeO_x$), gallium oxide ($GaO_x$), lanthanum oxide ($LaO_x$), niobium oxide ($NbO_x$), titanium oxide ($TiO_x$), zirconium oxide ($ZrO_x$), tantalum oxide ($TaO_x$), magnesium oxide ($MgO_x$), or a combination thereof.

Tiers 164 of alternating nitride materials 166 and dielectric materials 126 are formed adjacent to (e.g., on) the doped semiconductive material 122, as shown in FIG. 1. The tiers 164 may be formed by conventional techniques. The slit sacrificial structure 114 may be formed of and include one or more materials that are selective etchable relative to the materials of the tiers 164.

Pillar openings are formed through the tiers 164 and at least partially into the semiconductive material 108, exposing surfaces of the tiers 164, the doped semiconductive material 122, the source contact sacrificial structure 148, and the semiconductive material 108. The pillar openings may be formed by conventional techniques, such as by conventional photolithography and removal processes, such as a conventional dry etch process. Cell films 140 may be conformally formed in the pillar openings by conventional techniques. A first fill material 134 may be formed in a remaining volume of the pillar openings, the cell films 140 and the first fill material 134 forming a pillar 130. The cell films 140 are shown in the drawings as being a single material for simplicity. However, the cell films 140 may include multiple materials, such as a charge blocking material, a charge trap material, a tunnel dielectric material, and a channel. Each of these materials may be formed using conventional techniques. One or more voids may optionally be present in the interior of the first fill material 134. The charge blocking material, the charge trap material, the tunnel dielectric material, and the channel of the cell films 140 are positioned in order from the outermost material to an innermost material relative to an axial centerline of the pillars 130. As shown in FIG. 2, the pillars 130 are distributed between slit sacrificial structures 114. By way of example only, the pillars 130 may be arranged in groups of staggered rows of pillars 130 and laterally spaced from one another.

The charge blocking material of the cell films 140 may be formed of and include a dielectric material. By way of example only, the charge blocking material may be one or more of an oxide (e.g., silicon dioxide), a nitride (silicon nitride), and an oxynitride (silicon oxynitride), or another material. In some embodiments, the charge blocking material is silicon dioxide.

The charge trap material of the cell films 140 may be formed of and include at least one memory material and/or one or more conductive materials. The charge trap material may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap material is silicon nitride.

The tunnel dielectric material of the cell films 140 may include one or more dielectric materials, such as one or more of a silicon nitride material or a silicon oxide material. In some embodiments, the tunnel dielectric material is a so-called "ONO" structure that includes silicon dioxide, silicon nitride, and silicon dioxide.

The channel of the cell films 140 may be formed of and include a semiconductive material, a non-silicon channel material, or other channel material. The material of the channel may include, but is not limited to, a polysilicon material (e.g., polycrystalline silicon), a III-V compound semiconductive material, a II-VI compound semiconductive material, an organic semiconductive material, GaAs, InP, GaP, GaN, an oxide semiconductive material, or a combination thereof. In some embodiments, the channel is polysilicon, such as a doped polysilicon. The channel may be configured as a so-called doped hollow channel (DHC) or other configuration. The first fill material 134 may be a dielectric material, such as silicon dioxide.

Figure 3:
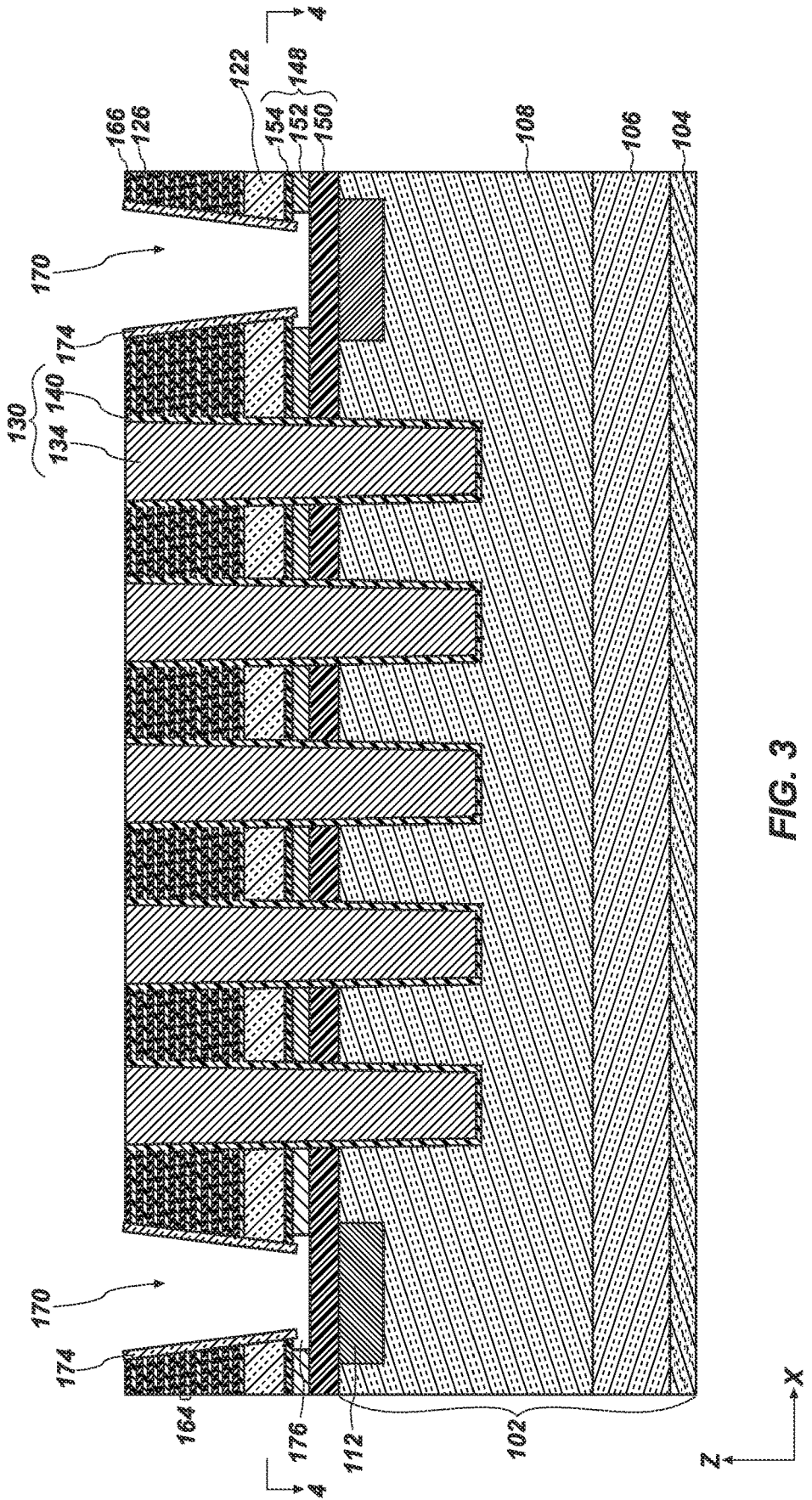

A portion of the tiers 164, a portion of the doped semiconductive material 122, and the slit sacrificial structure 114 is removed, as shown in FIG. 3, to form a slit 170 that extends through the tiers 164, the doped semiconductive material 122, and the third sacrificial material 154, and an opening 176 in the second sacrificial material 152 of the source contact sacrificial structure. The tiers 164, doped semiconductive material 122, and the slit sacrificial structure 114 may be removed by one or more etch processes, such as by using conventional etch conditions, to expose the source contact sacrificial structure 148. The slit sacrificial structure 114 may be substantially completely removed, with a portion of a dielectric material, optionally, remaining adjacent to the second sacrificial material 152. If a single etch process is conducted, the tiers 164, the doped semiconductive material 122, and the slit sacrificial structure 114 may be substantially removed by the single etch process. If more than one etch process is conducted, one or more materials of the slit sacrificial structure 114 are removed or partially removed during the first etch process to form the slit 170 and a second etch process may be conducted to remove additional materials of the slit sacrificial structure 114. For convenience, the slit 170 and the opening 176 are collectively referred to hereinafter as the slit 170.

Figure 4:
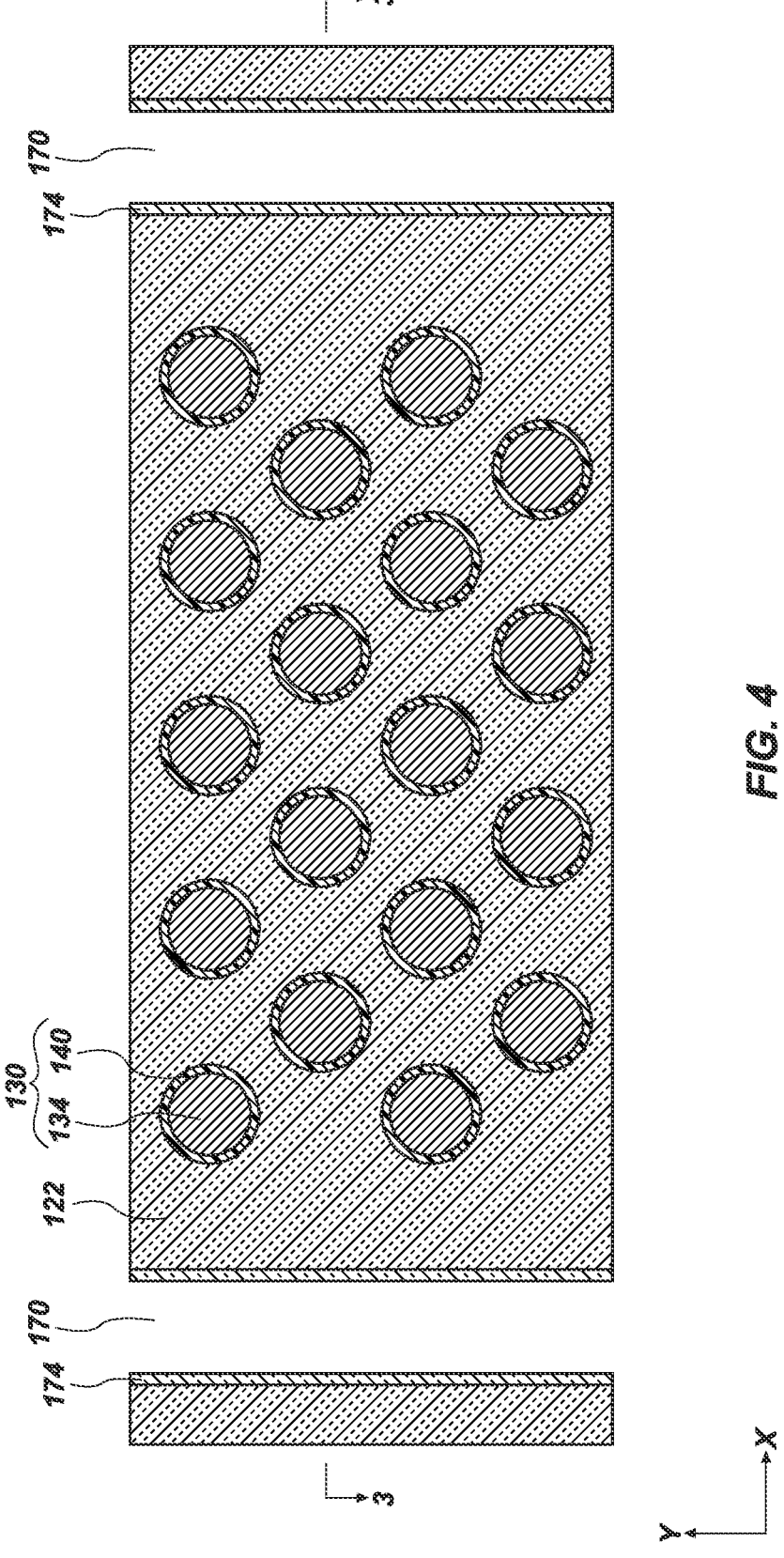

A slit liner 174 is formed on exposed surfaces of the tiers 164, the doped semiconductive material 122, and the third sacrificial material 154 in the slit 170 as shown in FIGS. 3 and 4. The slit liner 174 may be conformally formed by conventional techniques such that a portion (e.g., a volume) of the slit 170 remains open (e.g., unoccupied). The slit liner 174 may be formed of and include a dielectric material, a semiconductive material, or a conductive material. In some embodiments, the slit liner 174 is undoped polysilicon. The slit liner 174 may be formed to a thickness of from about 200 Å to about 400 Å. A portion of the slit liner 174 is removed from a bottom surface of the slit 170 to form the opening 176, exposing the first sacrificial material 150 of the source contact sacrificial structure 148. The slit liner 174 at the bottom surface of the slit 170 may be removed by conventional techniques.

Figure 5:
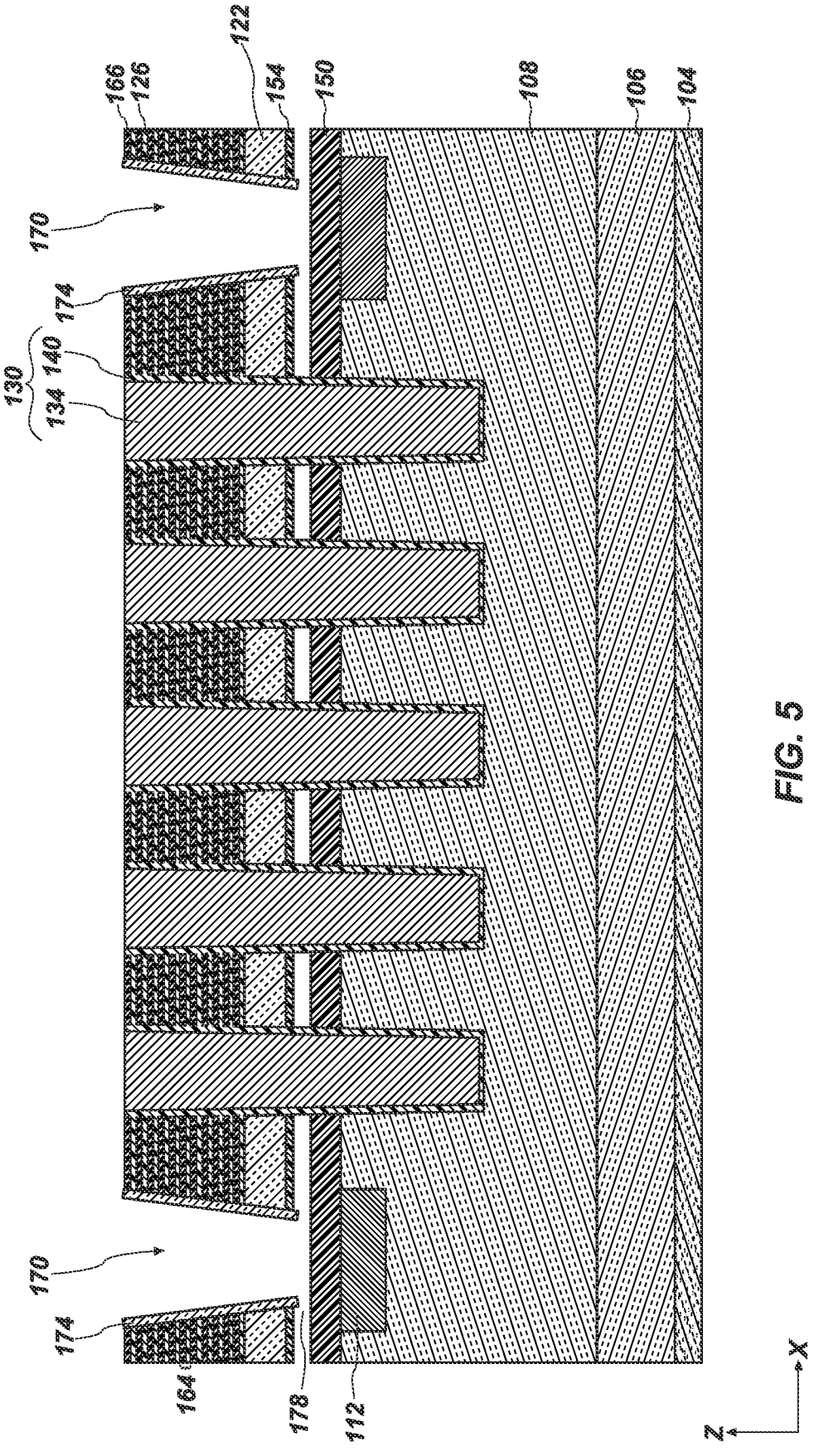
Figure 6:
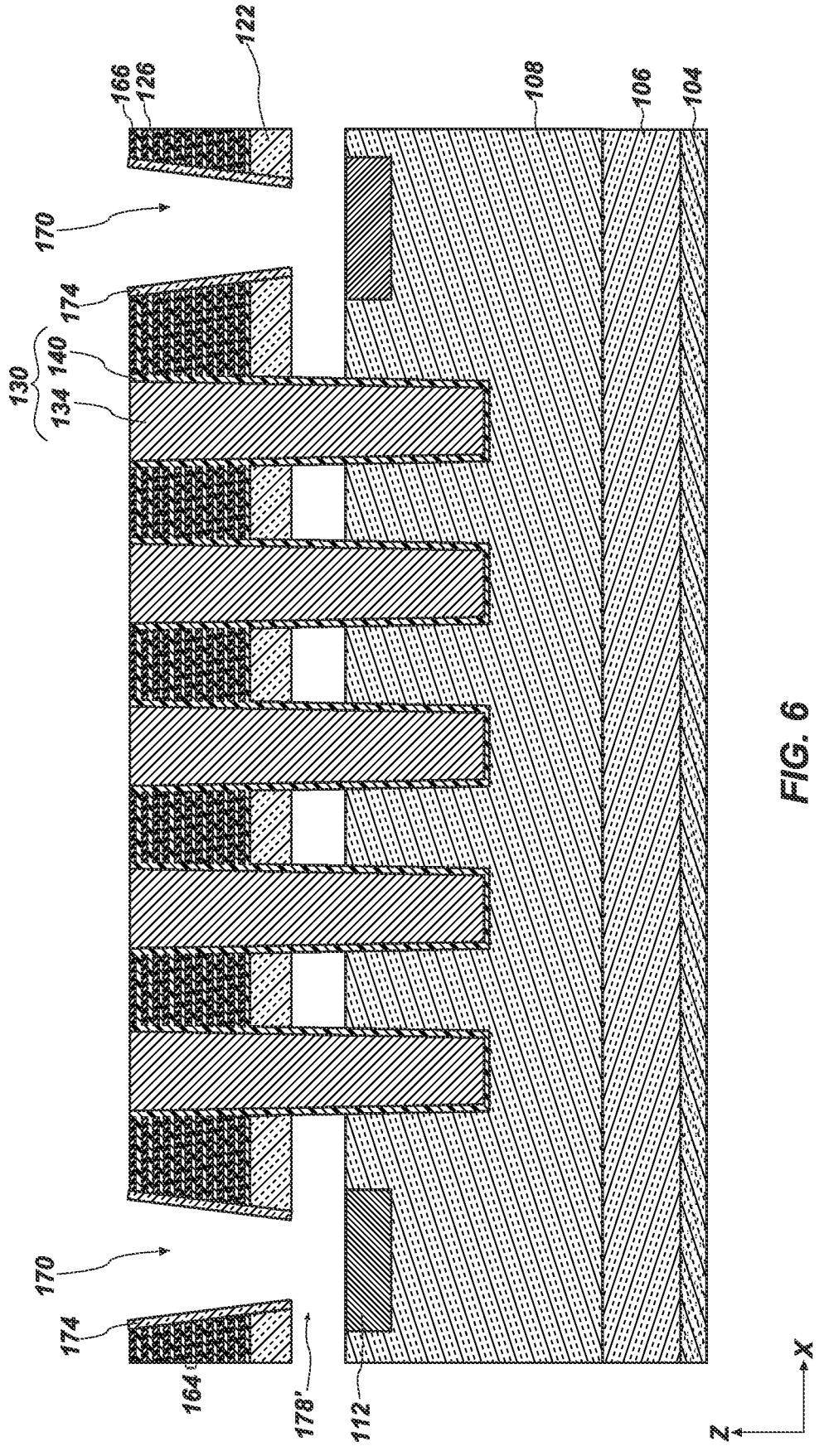

To provide access to the pillars 130, the source contact sacrificial structure 148 and portions of the cell films 140 charge blocking material, charge trap material, and tunnel dielectric material are sequentially removed, as shown in FIGS. 5 and 6. The source contact sacrificial structure 148 is substantially removed while a majority of the doped semiconductive material 122 remains intact (e.g., unetched) by selecting the etch conditions used to remove the source contact sacrificial structure 148. In other words, the doped semiconductive material 122 is substantially resistant to the etch conditions used to remove the source contact sacrificial structure 148. The second sacrificial material 152 is removed through the slit 170, as shown in FIG. 5, and a first source contact opening 178 formed. As described below, the size of the first source contact opening 178 is sequentially increased (e.g., enlarged) to provide access to the pillars 130 following the removal of the source contact sacrificial structure 148.

The second sacrificial material 152 of the source contact sacrificial structure 148 is selectively removed without substantially removing the first and third sacrificial materials 150, 154 or the cell films 140. The second sacrificial material 152 may be selectively etched by conventional techniques, such as by conventional etch conditions, which are selected depending on the chemical composition of the second sacrificial material 152 relative to the chemical composition of other exposed materials. For instance, if the first sacrificial material 150, the third sacrificial material 154, and the cell films 140 exhibit slower etch rates than the etch rate of the second sacrificial material 152, the second sacrificial material 152 is substantially removed relative to the first sacrificial material 150, the third sacrificial material 154, and the cell films 140. By way of example only, if the first sacrificial material 150, the third sacrificial material 154, and charge blocking material are silicon oxide materials and the second sacrificial material 152 is a silicon nitride material, an etch chemistry formulated to remove silicon nitride may be used, such as a phosphoric acid-based etch chemistry. The doped semiconductive material 122 is not exposed to (e.g., is protected from) the etch conditions by the slit liner 174, the tiers 164, and the third sacrificial material 154.

As shown in FIG. 6, one or more materials of the cell materials 140 are removed to expose the channel of the cell materials 140. An exposed portion of the first sacrificial material 150, the third sacrificial material 154, and outermost materials of the cell materials 140 are selectively removed from within the first source contact opening 178, without substantially removing the slit liner 174. The outermost materials of the cell materials 140 may include the charge blocking material, the charge trap material, and the tunnel dielectric material, exposing the channel of the cell materials 140. For simplicity and convenience, FIG. 6 (and later FIGS. 7-9) shows the cell materials 140 as being absent laterally adjacent to an intersection of the source contact 120 and the pillars 130. However, it is understood that the channel of the cell materials 140 remains and extends continuously from the tiers 124 and into the semiconductive material 108. The charge blocking material, the charge trap material, and the tunnel dielectric material of the cell materials 140, the first sacrificial material 150, and the third sacrificial material 154 may be selectively etched by conventional techniques, which are selected depending on the chemical composition of the cell materials 140, the first sacrificial material 150, and the third sacrificial material 154 relative to the chemical composition of other exposed materials. By selecting the etch conditions, the cell materials 140 adjacent to the first source contact opening 178, the first sacrificial material 150, and the third sacrificial material 154 are removed. The first sacrificial material 150 and third sacrificial material 154 may be substantially completely removed while the exposed portion of the cell materials 140, adjacent (e.g., laterally adjacent) to the first source contact opening 178, is partially removed. Removing the first sacrificial material 150, the third sacrificial material 154, and the portions of the cell materials 140 increases the size of the first source contact opening 178, forming first source contact opening 178'. In some embodiments, the doped semiconductive material 122 is carbon-doped silicon nitride and is selectively etchable relative to silicon dioxide of the source contact sacrificial structure 148 and silicon dioxide of the pillars 130.

By way of example only, if the first sacrificial material 150, the third sacrificial material 154, and the cell materials 140 are silicon oxide materials, an etch chemistry formulated to selectively remove silicon oxide materials may be used, such as an HF-based etch chemistry. Forming the first source contact opening 178' exposes a top surface of the semiconductive material 108 and a top surface of the oxide fill region 112. Forming the first source contact opening 178' also exposes a bottom horizontal surface of the doped semiconductive material 122 and exposes a portion of the channel of the cell materials 140. The bottom surface of the doped semiconductive material 122 may be substantially coplanar with a bottom surface of the slit liner 174, while a bottom horizontal surface of the cell materials 140 may be recessed relative to (e.g., not coplanar with) the bottom surfaces of the doped semiconductive material 122 and the slit liner 174.

A source contact opening liner (not shown) may be formed within the first source contact opening 178'. The source contact opening liner may be formed along the top surfaces of the semiconductive material 108 and the oxide fill region 112, along the bottom surfaces of the doped semiconductive material 122 and the slit liner 174, and along the exposed portions of the materials of the pillar 130. By way of example only, the source contact opening liner may be a dielectric material, such as a silicon oxide material or a silicon nitride material, that exhibits etch selectivity relative to other exposed materials. In some embodiments, the source contact opening liner is a highly conformal silicon dioxide.

The exposed portion of the materials of the pillars 130 is then selectively removed, without substantially removing the materials of the pillars 130 or the source contact opening liner from vertical surfaces. The portion of the charge trap material and portion of the source contact opening liner that is laterally adjacent to the first source contact opening 178' is removed by selectively etching portion of the materials of the pillars 130, which exposes a portion of the tunnel dielectric material. The exposed portion of the materials of the pillars 130 and source contact opening liner may be removed by conventional techniques. By way of example only, if the pillars 130 include a charge trap material that is a silicon nitride material, an etch chemistry formulated to remove silicon nitride may be used, such as a phosphoric acid-based etch chemistry. By selecting the etch conditions, the charge trap material laterally adjacent to the first source contact opening 178' may be removed.

Figure 9:
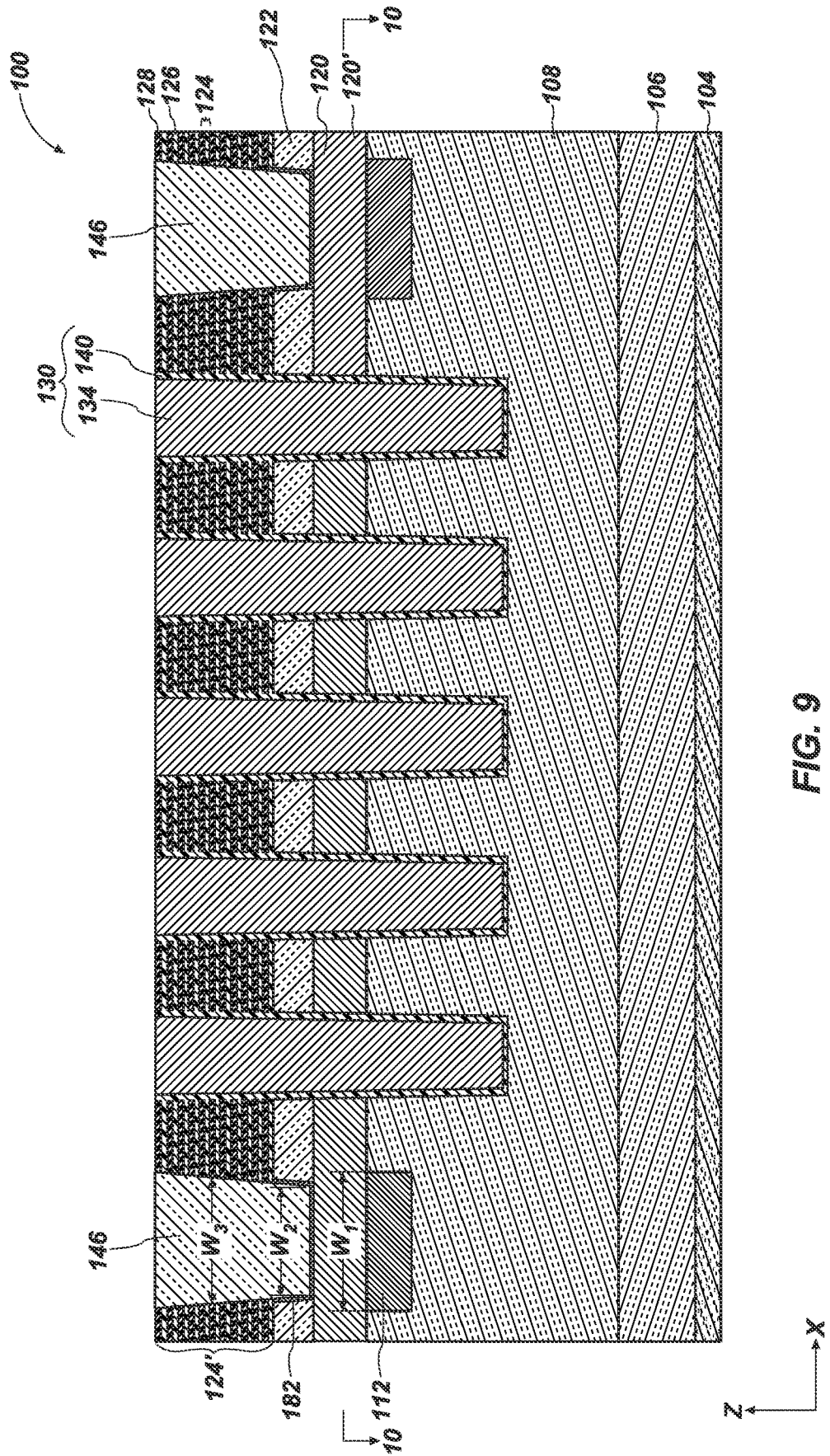
FIG. 9 is a cross-sectional, elevational, schematic illustration of the electronic device in accordance with embodiments of the disclosure formed by the process of FIGS. 1-8.

The doped semiconductive material 122 may function as an offset between the source stack 102 and the tiers 164 during the fabrication of an electronic device 100 (see FIG. 9). Since the first sacrificial material 150, the second sacrificial material 152, and the third sacrificial material 154 of the source contact sacrificial structure 148 provide protection to (e.g., masking of) various materials during the process acts indicated in FIG. 5, the initial thickness of the first sacrificial material 150, the second sacrificial material 152, and the third sacrificial material 154 are selected to be sufficiently thick to survive (e.g., withstand) the etch conditions used to provide lateral access to the pillars 130. The source contact opening 178' exhibits a height, which corresponds to a thickness of the source contact 120 ultimately formed in the first source contact opening 178'. The thickness of the source contact 120 (see FIG. 9) is greater than or equal to a combined thickness of the materials of the as-formed source contact sacrificial structure 148 (see FIG. 1). By determining the desired thickness of the source contact 120, the thickness of the source contact sacrificial structure 148 may be selected.

While the first sacrificial material 150, the second sacrificial material 152, and the third sacrificial material 154 have been removed (e.g., are not present) in the perspective of FIG. 6, these materials of the source contact sacrificial structure 148 may be present in other portions (not shown)

of the electronic device 100, such as in portions of the electronic device 100 distal to the slit 170. The source contact sacrificial structure 148 may be present (e.g., visible), for example, in peripheral regions of the electronic device 100. In other words, the source contact sacrificial structure 148 may be positioned between the semiconductive material 108 and the doped semiconductive material 122 in the other portions of the electronic device 100. Therefore, although the source contact 120 is present between the doped semiconductive material 122 and the source stack 102 of the electronic device 100 in the perspectives shown in FIGS. 7-10, the other portions of the electronic device 100 will include the source contact sacrificial structure 148 between the doped semiconductive material 122 and the source stack 102.

The first source contact opening 178' may provide access (e.g., lateral access) to the pillars 130 following the substantially complete removal of the source contact sacrificial structure 148, which may expose materials of the pillars 130.

Figure 7:
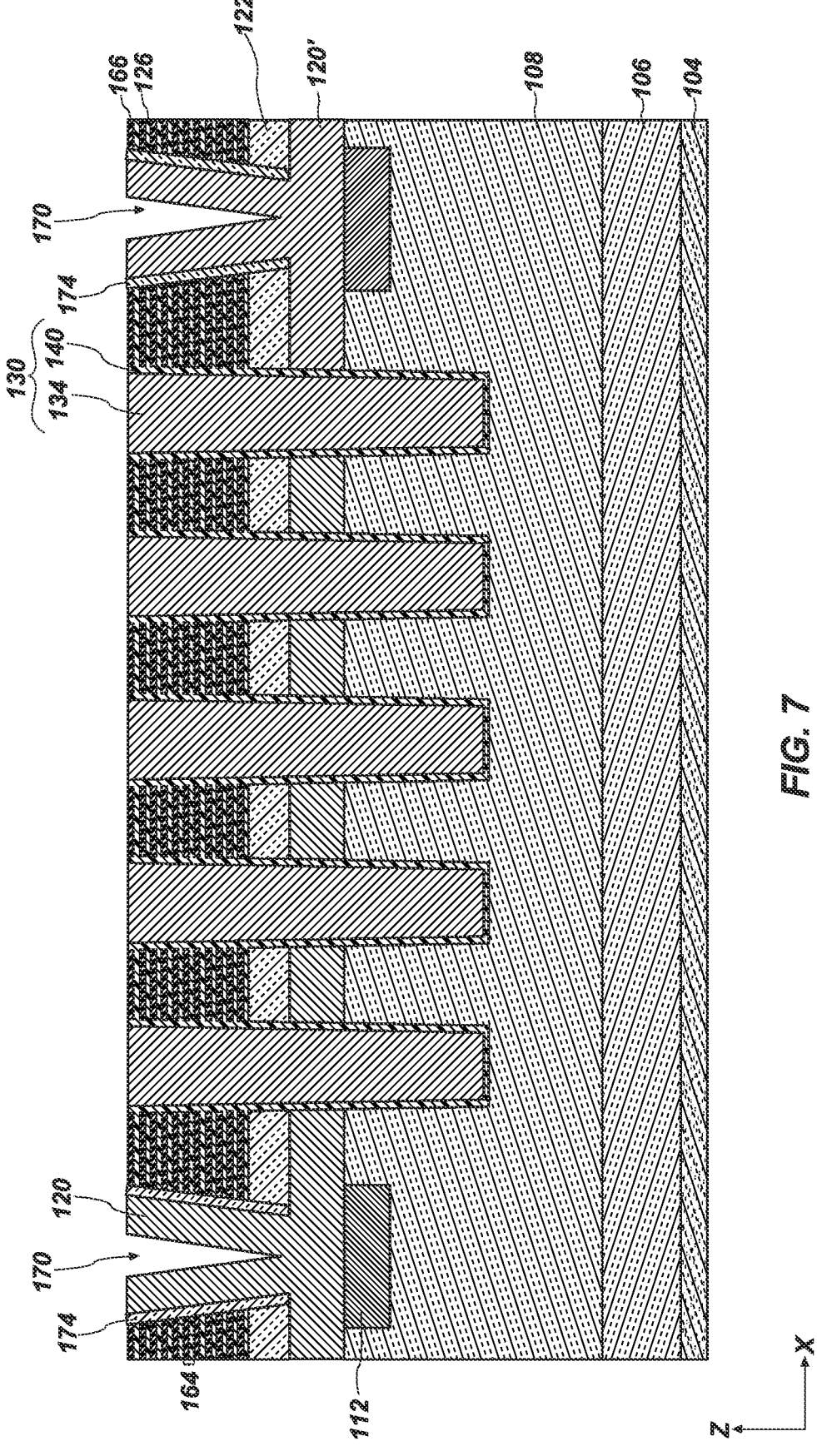

As shown in FIG. 7, a conductive material 120' of the source contact 120 is formed within the first source contact opening 178'. The conductive material 120' may be conformally formed in the first source contact opening 178', substantially completely filling the first source contact opening 178' and filling a portion of the slit 170. In some embodiments, the conductive material 120' is polysilicon, such as N$^+$ doped polysilicon. The conductive material 120' may be formed at a thickness of from about 500 Å to about 2000 Å, such as from about 700 Å to about 1500 Å, from about 700 Å to about 1800 Å, from about 800 Å to about 1500 Å, from about 800 Å to about 1800 Å, or from about 800 Å to about 1800 Å. The conductive material 120' extends in a horizontal direction between the doped semiconductive material 122 and the semiconductive material 108 and contacts the pillars 130. An oxidation act may be conducted to activate dopants in the conductive material 120' and so that the conductive material 120' is substantially continuous and includes few holes, voids, or a seam.

Figure 8:
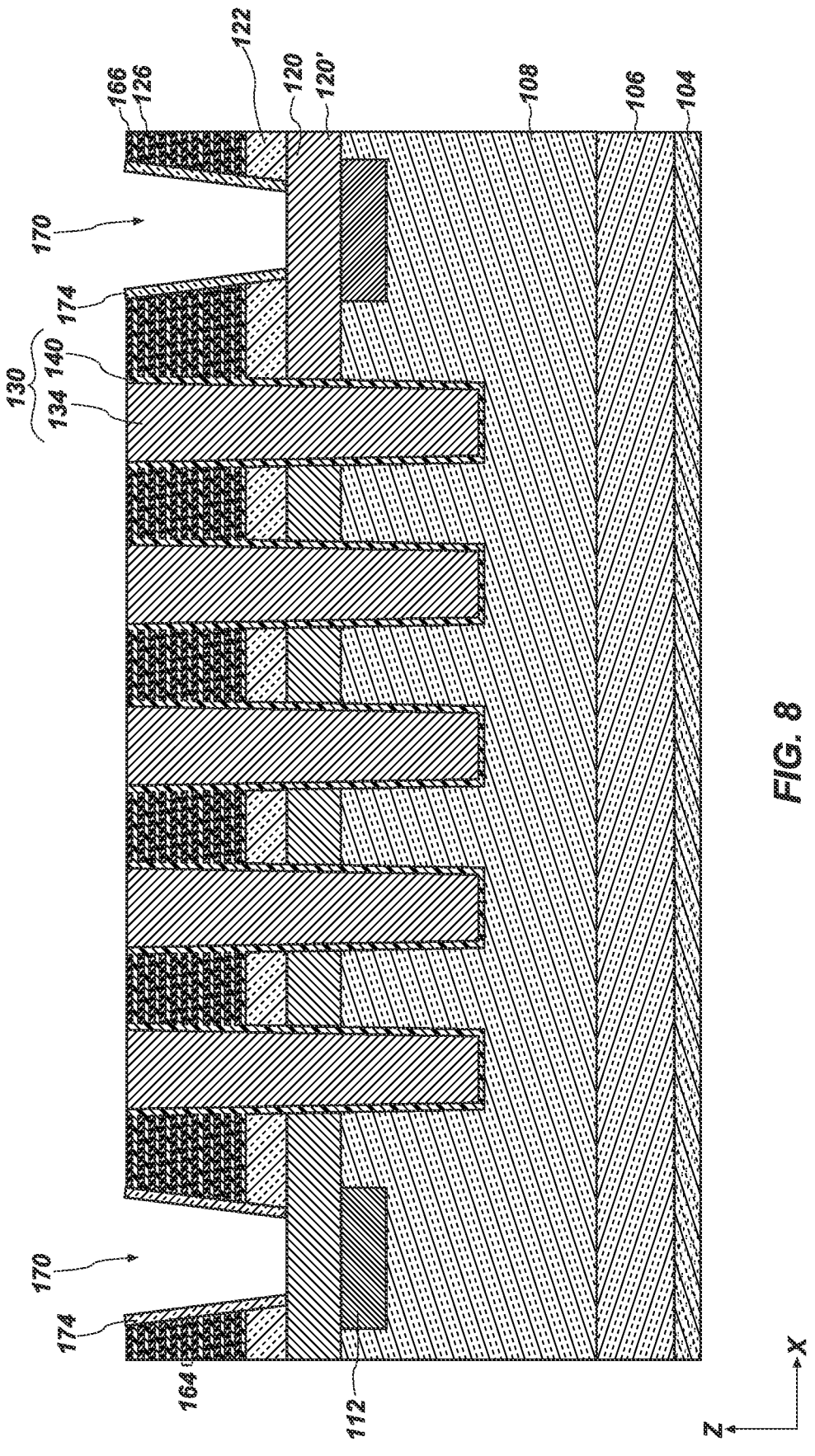

Referring to FIG. 8, a portion of the conductive material 120' may be removed vertically along the slit liner 174. The conductive material 120' is substantially removed from the slit 170 while the conductive material 120' remains in the remaining first source contact opening 178', which forms the source contact 120. While the conductive material 120' is depicted as being removed completely from the slit and along the slit liner, more of the conductive material may be removed, while maintaining the source contact as continuous. The conductive material 120' is removed by conventional techniques. The resulting source contact 120 extends between the doped semiconductive material 122 and the semiconductive material 108 and contacts (e.g., directly contacts) the pillars 130, and the cell materials 140. The source contact 120 directly contacts a lower surface of the doped semiconductive material 122 and an upper surface of the semiconductive material 108 and of the oxide fill region 112. The source contact 120 also directly contacts upper and lower horizontal surfaces of the tunnel dielectric material, the charge trap material, and the cell materials 140 and sidewalls of the channel. The source contact 120 is separated from the tiers 164 by the doped semiconductive material 122.

Figure 10:
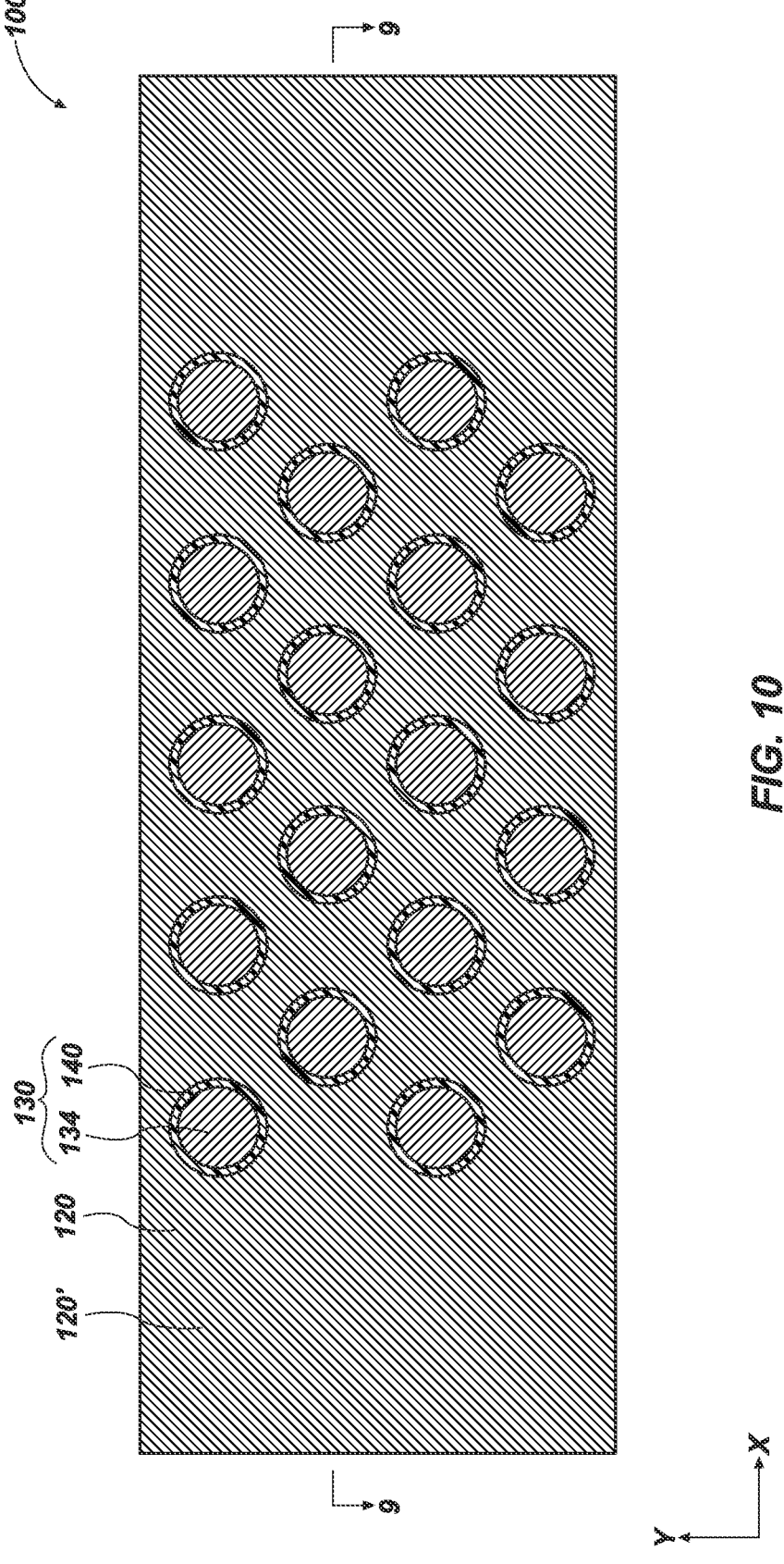
FIG. 10 is a simplified partial top-down view of the electronic device of FIG. 9.

Subsequent process acts are then conducted by conventional techniques to form the electronic device 100 as shown in FIGS. 9 and 10. FIG. 9 is a partial cross-sectional schematic illustration taken through the line 9-9 in FIG. 10, and FIG. 10 is a partial cross-sectional top-down schematic illustration taken through the line 10-10 in FIG. 9. Referring to FIGS. 9 and 10, the slit liner may be substantially removed from the sides of the doped semiconductive material 122 and the tiers 164. The exposed portion of the source contact 120 may be oxidized by conventional techniques to form a source contact liner 182 of the source contact 120. The source contact liner 182 may be present on sidewalls of the doped semiconductive material 122, and the source contact 120. The source contact liner 182 may extend to a bottom surface of the lowermost dielectric materials 126 of the tiers 164. Therefore, the source contact liner 182 may form a continuous liner from the bottom surface of the lowermost dielectric materials 126 of the tiers, along sidewalls of the doped semiconductive material 122, and along the upper surface of the source contact 120. The top surface of the oxide fill region 112 may be substantially coplanar with an upper portion of the source stack 102.

A replacement gate process is conducted to remove the nitride materials 166 of the tiers 164 and to form the conductive materials 128 of the tiers 124. The nitride materials 166 may be removed by exposing the tiers 164 to a wet etch chemistry formulated to remove, for example, silicon nitride of the tiers 164. The wet etchant may include, but is not limited to, one or more of phosphoric acid, sulfuric acid, hydrochloric acid, nitric acid, or a combination thereof. In some embodiments, the nitride materials 166 of the tiers 164 are removed using a so-called "wet nitride strip" that includes phosphoric acid. While FIGS. 1-10 illustrate the formation of the electronic device 100 by the replacement gate process, methods according to embodiments of the disclosure may be used to form the electronic device 100 by a floating gate process.

A second fill material 146 may be formed in the slit 170. The second fill material 146 may comprise one or more materials such as a single dielectric material, a combination of a dielectric material and silicon, or a combination of a dielectric material and a conductive material. The second fill material 146 may exhibit different widths in the lateral direction, with a lower portion of the second fill material 146 exhibiting a different width $W_2$ than a width $W_3$ of an upper portion of the second fill material 146. The second fill material 146 is formed above (e.g., vertically above) the oxide fill region 112, and the width of the second fill material 146 laterally adjacent to the doped semiconductive material 122 may be narrower than the width $W_1$ of the oxide fill region 112. The width of a portion of the second fill material 146 laterally adjacent to the doped semiconductive material 122 may be substantially the same as a width of a portion of the second fill material 146 laterally adjacent to a bottom of the tiers 124. The different widths of the second fill material 146 may be present in some regions of the electronic device 100, such as in one or more or array regions, periphery regions of the electronic device 100.

The electronic device 100 includes the source stack 102 including the oxide fill region 112. The source contact 120 is adjacent to (e.g., vertically adjacent to, on) the source stack 102. The doped semiconductive material 122 is adjacent to (e.g., vertically adjacent to, on) the source contact 120 and includes a source contact liner 182.

The tiers 124 of alternating dielectric materials 126 and conductive materials 128 are adjacent to (e.g., vertically adjacent to, on) the doped semiconductive material 122. Some of the conductive materials 128 are configured as so-called "replacement gate" word lines (e.g., word lines formed by a so-called "replacement gate" or "gate late" process). Other conductive materials 128, such as one or more of the lowermost conductive materials 128, are configured as select gate sources (SGSs) (not shown) and one or more of the uppermost conductive materials 128 are configured as select gate drains (SGDs) (not shown).

Figure 16:
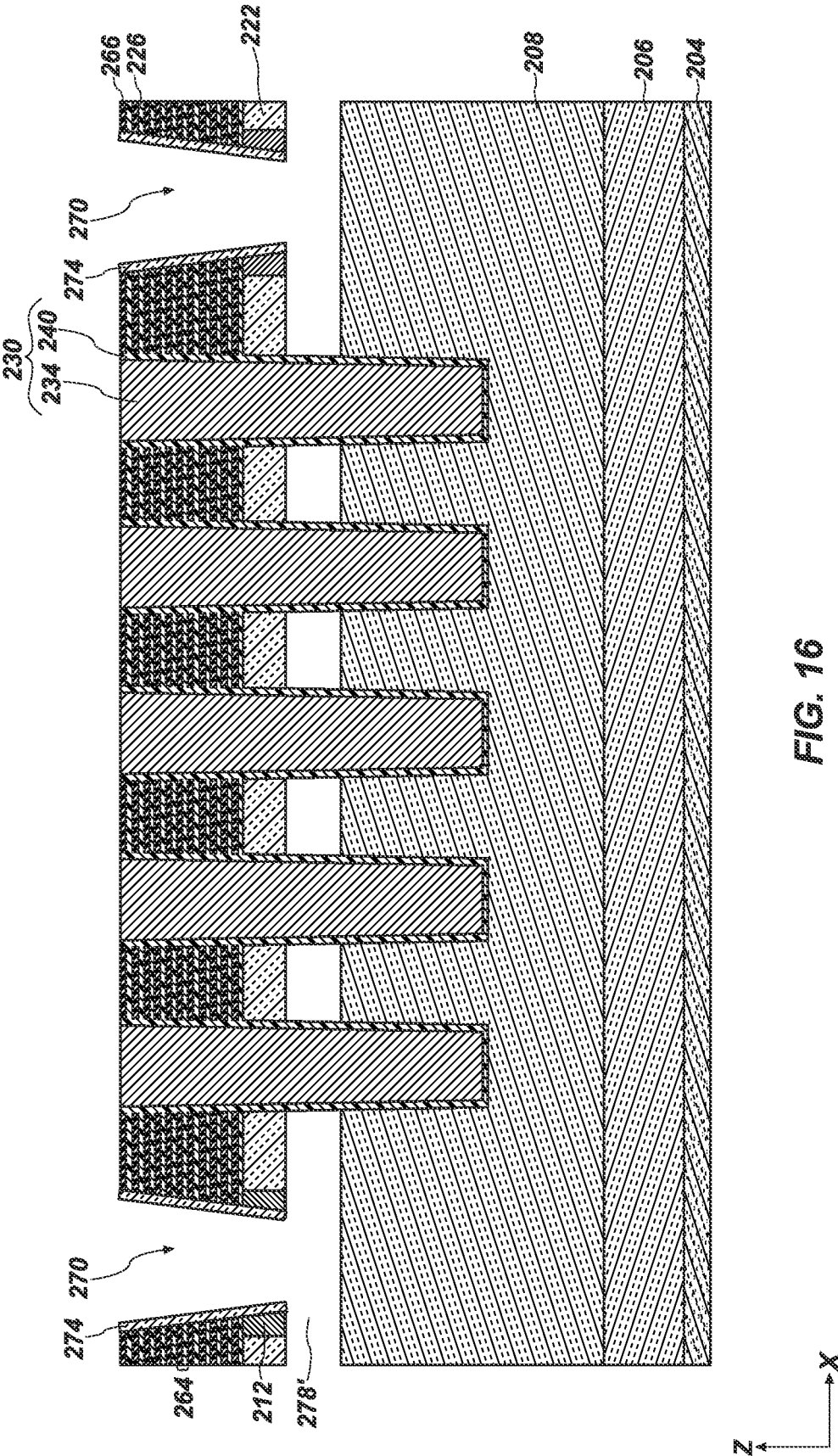

The thickness of the doped semiconductive material 122 may be selected depending on a desired distance between the source contact 120 and the SGS of the tier stack 124' (see FIG. 16). The thickness of the doped semiconductive material 122 may be sufficient to separate (e.g., physically separate) the source contact 120 from the SGS by a desired distance. The distance separating the source contact 120 from the SGS of the tiers 124, corresponds to the thickness of the doped semiconductive material 122 and the adjacent dielectric materials 126 of the tiers 124. The doped semiconductive material 122 may also function as an etch stop material during subsequent process acts. In some embodiments, the thickness of the doped semiconductive material 122 is about 500 Å.

The pillars 130 (e.g., memory pillars) extend through the tiers 124, the doped semiconductive material 122, the source contact 120, and at least partially into the semiconductive material 108. The pillars 130 may include the first fill material 134, the channel, the tunnel dielectric material, and the charge trap material. The cell films 140 may be formed concentrically surrounding the first fill material 134. The cell materials 140 function as tunneling structures of the pillars 130 of the electronic device 100. In locations of the pillars 130 laterally adjacent to the source contact 120, the channel of the cell films 140 remains on sidewalls of the first fill material 134.

The second fill material 146 is adjacent to (e.g., vertically adjacent to, over) the oxide fill region 112 and the source contact 120, and adjacent to (e.g., laterally adjacent to, next to) the doped semiconductive material 122, and the tiers 124. The source contact liner 182 is between the second fill material 146 and the source contact 120, and between the second fill material 146 and the doped semiconductive material 122.

One or more electronic device 100 according to embodiments of the disclosure may be present in an apparatus or in an electronic system. The apparatus including the one or more electronic device 100, or the electronic system including the one or more electronic device 100 may include additional components, which are formed by conventional techniques. The additional components may include, but are not limited to, staircase structures, interdeck structures, contacts, interconnects, data lines (e.g., bit lines), access lines (e.g., word lines), etc. The additional components may be formed during the fabrication of the electronic device 100 or after the electronic device 100 has been fabricated. By way of example only, one or more of the additional components may be formed before or after the cell films 140 of the pillars 130 are formed, while other additional components may be formed after the electronic device 100 has been fabricated. The additional components may be present in locations of the electronic device 100 or the apparatus that are not depicted in the perspectives of FIGS. 1-10.

During formation of the electronic device 100 according to embodiments of the disclosure, the oxide fill region 112 provides etch protection (e.g., corrosion protection) to the source stack 102. Locating the oxide fill region 112 below the slit sacrificial structure 114 (FIG. 1) substantially reduces or eliminates removal of the semiconductive material 108 during the formation of the slit 170 and the first source contact opening 178'. The oxide fill region 112, therefore, protects the semiconductive material 108 from damage caused by the etch conditions (e.g., etch chemistries and process conditions) used to remove the source contact sacrificial structure 148. The source contact 120 may, therefore, be electrically coupled with the conductive materials 128 of the tiers 124, while substantially reducing or eliminating damage to the semiconductive material 108 and the source material 106. In conventional electronic devices lacking the oxide fill region 112, the source contact 120 may electrically short to the source material 106 if the semiconductive material 108 is damaged. In addition, block lifting may be caused by the etch conditions. By reducing the possibility of the semiconductive material 108 and the source material 106 being damaged by the etch conditions, the electronic device 100 according to embodiments of the disclosure may exhibit reduced block lifting. In addition, the semiconductive material 108 and the source material 106 may be protected by the oxide fill region 112 from damage caused by the wet nitride strip during the replacement gate process. The electron flow through conductive and semiconductive materials of the pillars 130 is also improved. In addition, by eliminating the cell films 140 (the tunnel dielectric material, the charge trap material, and the charge blocking material) from a conductive path between the channel and the SGS, sources of charge trap within the conductive path are reduced or eliminated. The doped semiconductive material 122 also provides an increased process margin during the fabrication of the electronic device 100. Therefore, electrical control of the electronic device 100 according to embodiments of the disclosure is improved relative to that of conventional electronic devices having a doped polysilicon material in a similar location, where interactions between a channel and memory cells of the conventional electronic devices occur.

Additional embodiments of the disclosure are shown in FIGS. 11 through 19, which illustrate the formation of electronic device 200. The elements and materials of the electronic device 200 are substantially the same as those described for FIGS. 1 through 10. FIGS. 11 through 19 are simplified, partial cross sectional views illustrating different processing stages. Throughout the remaining description and the accompanying figures, functionally similar features (e.g., structures, devices) are referred to with similar reference numerals. To avoid repetition, not all features and methodology shown in the remaining figures are described in detail herein. Rather, unless described otherwise below, a feature designated by a reference numeral of a previously described feature (whether the previously described feature is first described before the present paragraph, or is first described after the present paragraph) will be understood to be substantially similar to the previously described feature. Only those method acts that differ from the embodiments of the disclosure in FIGS. 1 through 10 are described in detail below.

Figure 11:
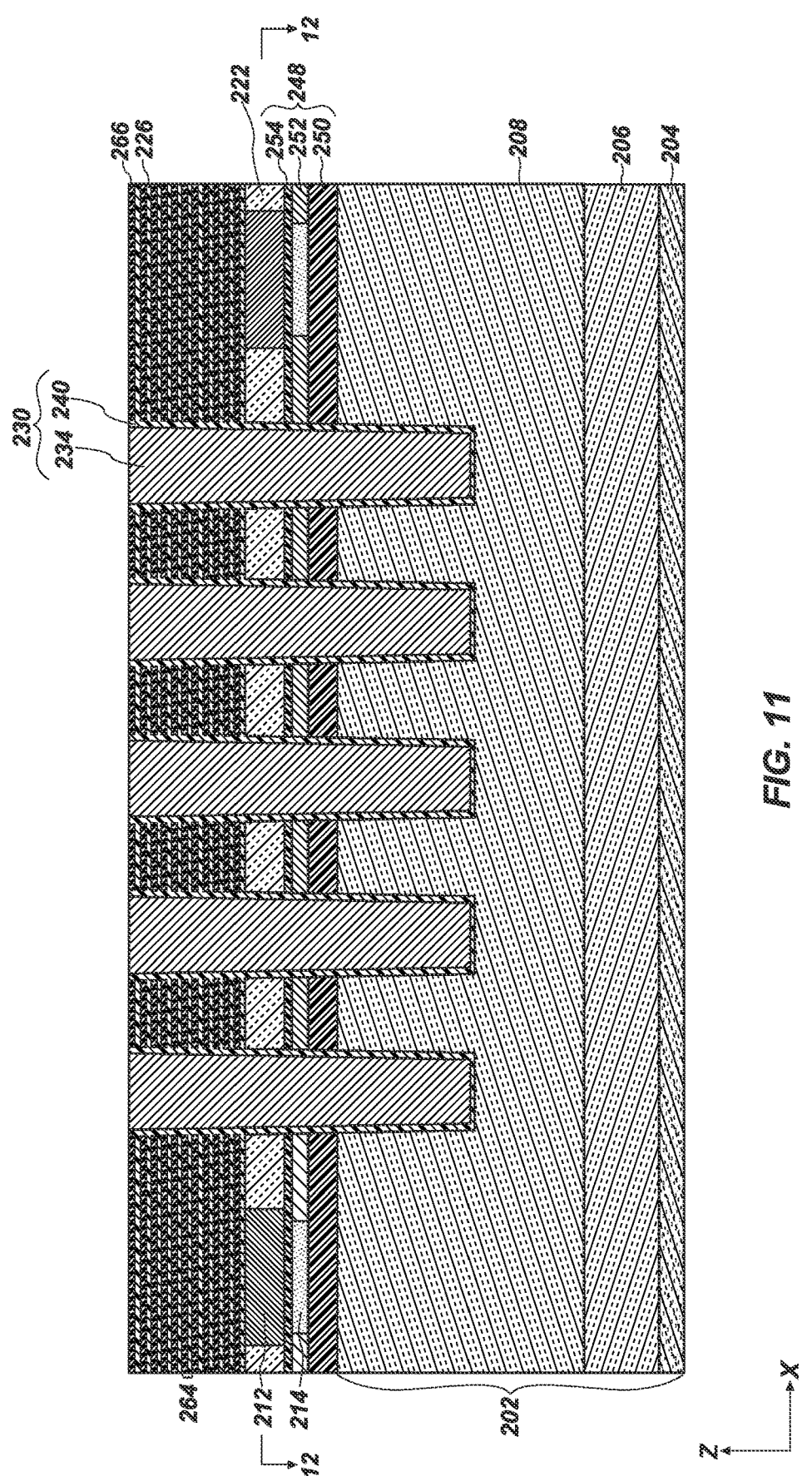
FIGS. 11, 13, and 15-18 are partial cross-sectional views illustrating a method of forming electronic devices in accordance with embodiments of the disclosure.
Figure 12:
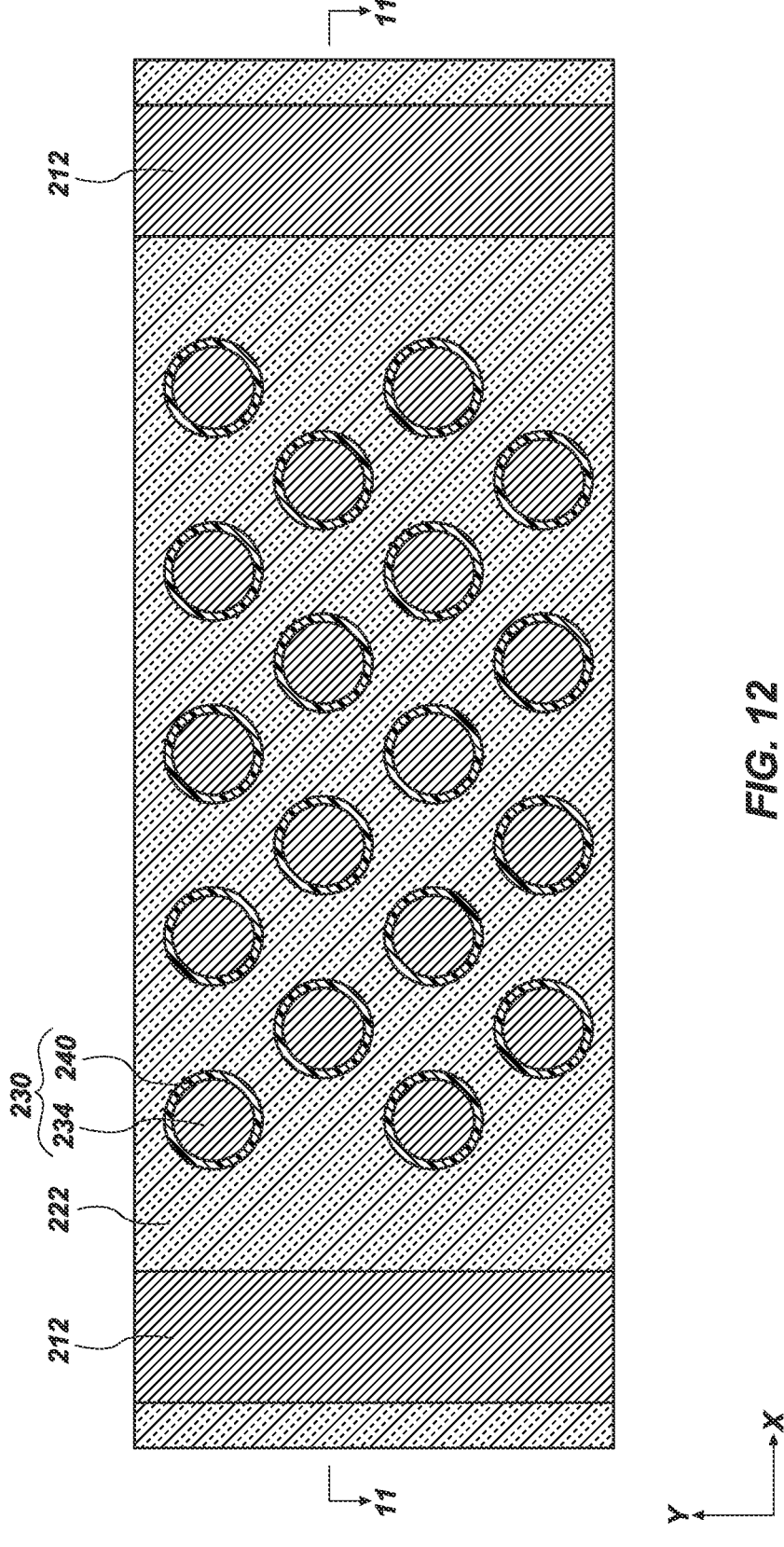
FIGS. 12, and 14 are partial top-down views illustrating a method of forming electronic devices in accordance with embodiments of the disclosure.

As shown in FIGS. 11 and 12, a source contact sacrificial structure 248 is formed over a source stack 202, and a doped semiconductive material 222 is formed above the source contact sacrificial structure 248, similar to the process described above for FIGS. 1 and 2. A slit sacrificial structure 214 is present in the second sacrificial material 252 and an oxide fill region 212 is formed adjacent (e.g., laterally adjacent) to the doped semiconductive material 222, similar to the process described above for FIGS. 1 and 2. The oxide fill region 212 is formed vertically above the slit sacrificial structure 214.

To form the oxide fill region 212, a mask may be formed over the doped semiconductive material 222 and patterned, similar to the process described above for FIGS. 1 and 2. A recess may be formed through the mask and the doped semiconductive material 222. The recess may extend to an upper surface of the third sacrificial material 254 of the source contact sacrificial structure 248. An oxide fill material may be formed (e.g., deposited) within the recess to form the oxide fill region 212 as described above for FIGS. 1 and 2. For example, the oxide fill material may include silicon oxide (SiO$_x$). By way of example, a conformal oxide may be deposited within the recess. Portions of the conformal oxide (e.g., portions above the recess) may be removed via conventional methods (e.g., a directional etch) to define the oxide fill region 212.

Tiers 164 of alternating nitride materials 166 and dielectric materials 126 are formed adjacent to the doped semiconductive material 222. The doped semiconductive material 222, tiers 264, and pillar 230 may be formed by a similar process as described above for FIG. 1. Pillars 230 may be positioned as described above for FIGS. 1 and 2. Source contact sacrificial structure 248 may be formed and positioned by a similar process as described above for FIG. 1.

Figure 13:
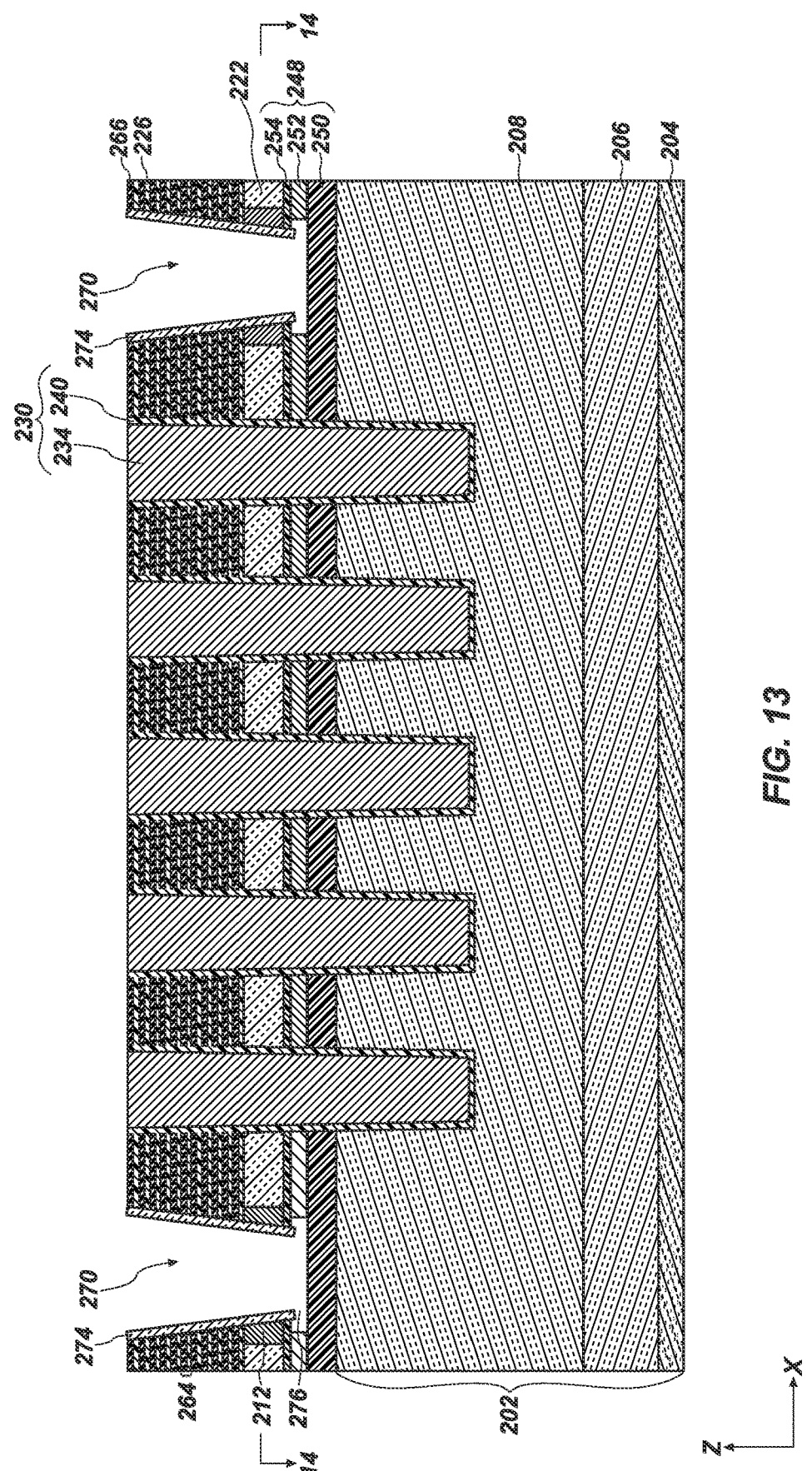
Figure 14:
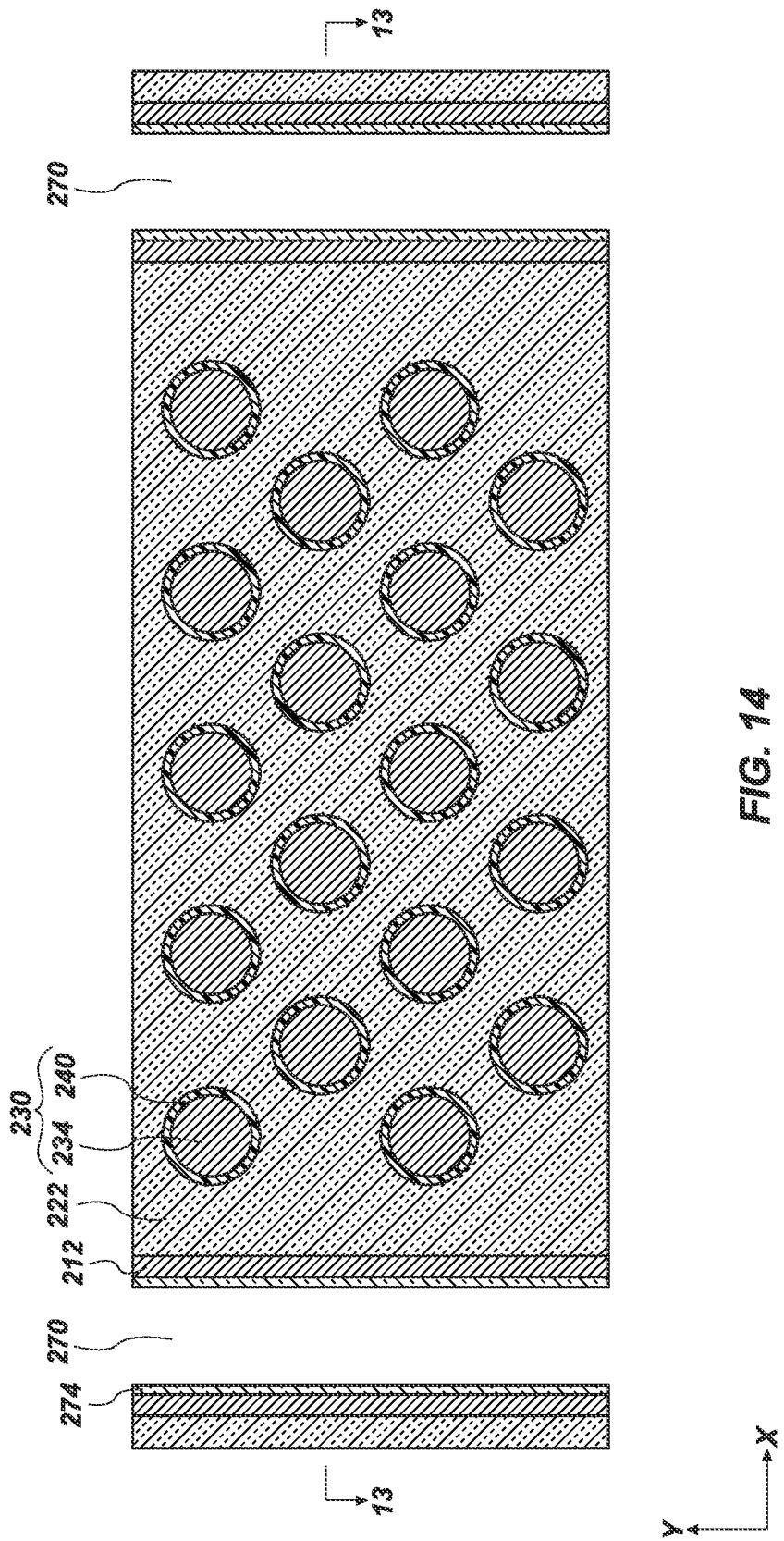
Figure 15:
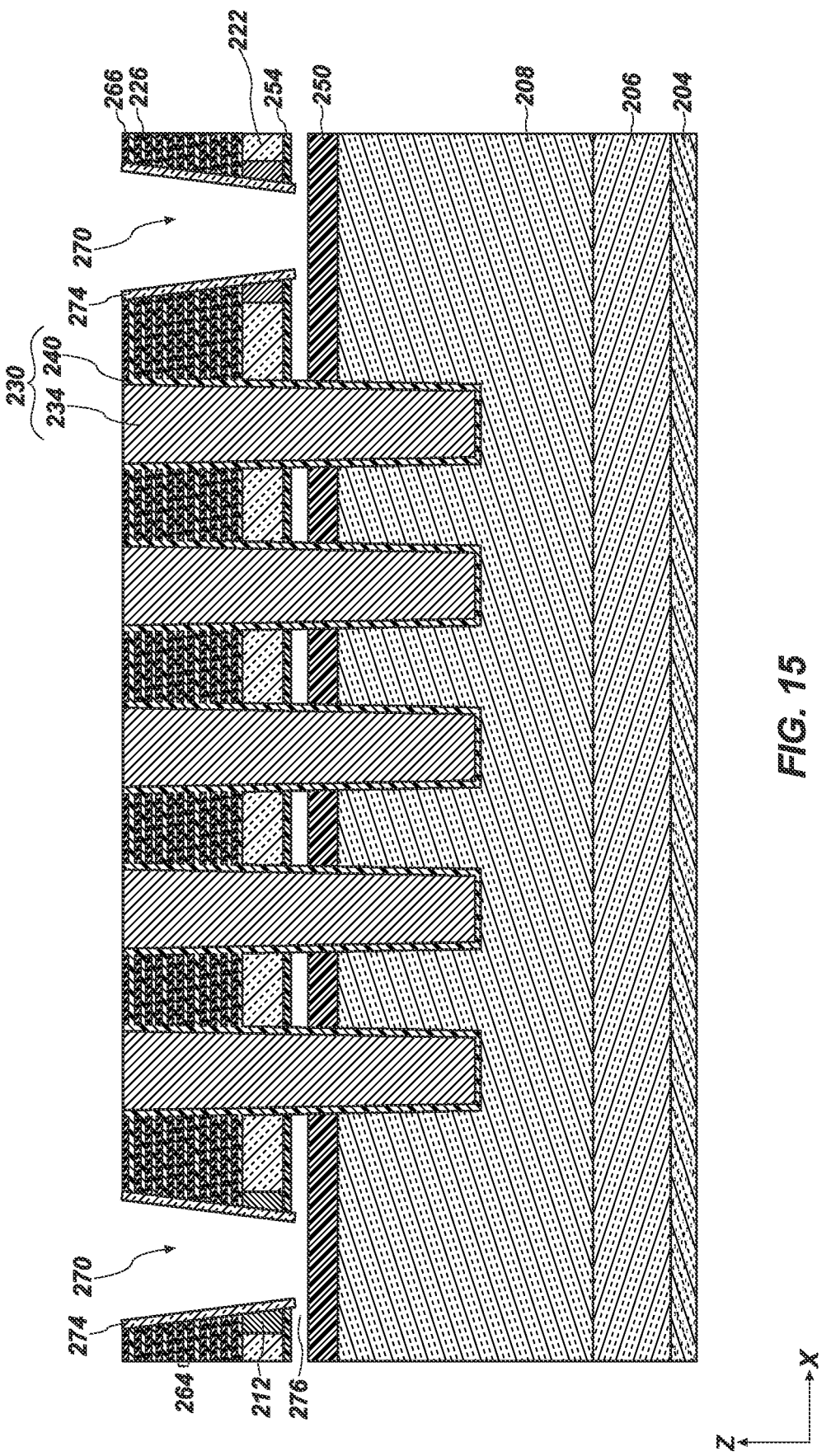

FIG. 13 is a partial cross-sectional schematic illustration taken through the line 13-13 in FIG. 14, and FIG. 14 is a partial cross-sectional top-down schematic illustration taken through the line 14-14 in FIG. 13. A portion of the tiers 264, a portion of the oxide fill region 212, a portion of the third sacrificial material 254, and the slit sacrificial structure 214 are removed, as shown in FIGS. 13 and 14, to form a slit 270 through the tiers 264, the third sacrificial material 254 and to form an opening 276 in the second sacrificial material 252 of the source contact sacrificial structure 248. The slit 270 and opening 276 may be formed and positioned by a similar process as described above for FIG. 3. For convenience, the slit 270 and the opening 276 are collectively referred to hereinafter as the slit 270. The slit 270 is formed through the oxide fill region 212. The vertically lowermost portion (e.g., the bottom) of the slit 270 is formed with a lateral width that is less than the lateral width of the oxide fill region 212.

As shown in FIGS. 13 and 14, a slit liner 274 is formed on exposed surfaces of the tiers 264, the oxide fill region 212, and into the opening 276. The slit liner 274 may be formed and positioned substantially similarly to those shown in FIG. 3.

To provide access to the pillars 230, the source contact sacrificial structure 248 and portions of the charge blocking material 240 and pillars 230 (charge trap material, and tunnel dielectric material) are sequentially removed substantially similarly to the methods and features described above, as shown in FIGS. 15 and 16.

Figure 17:
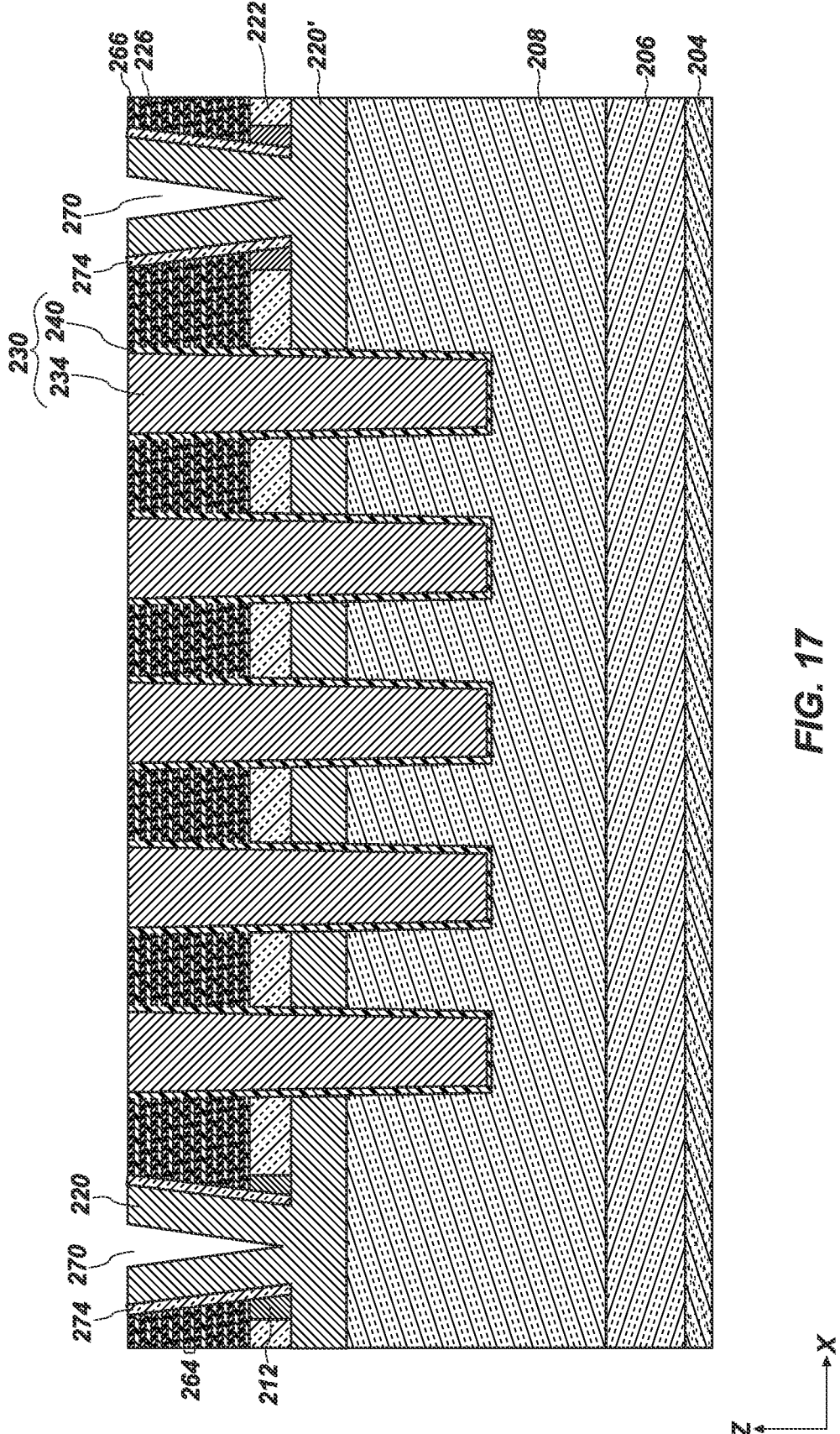
Figure 18:
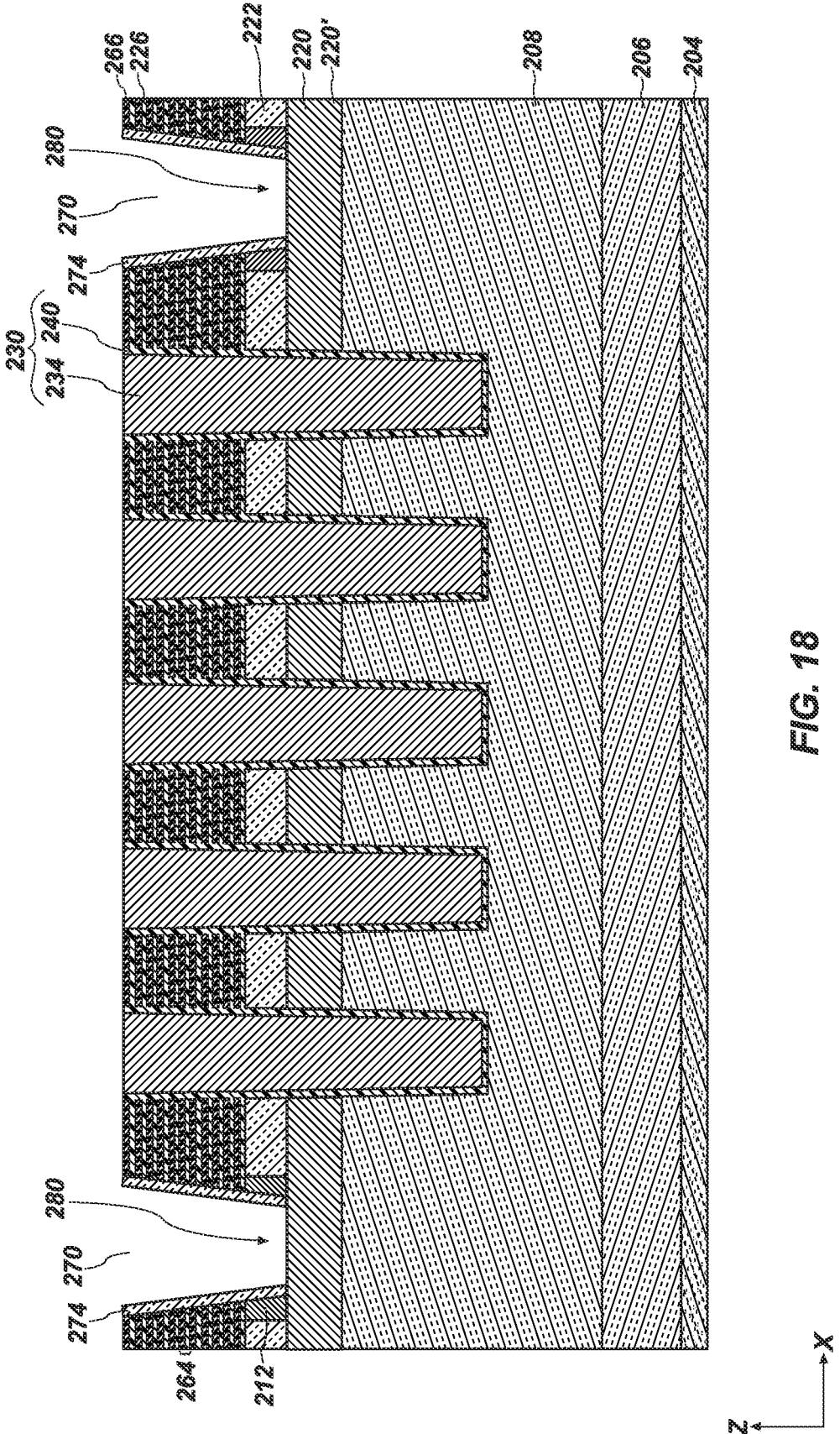

Methods and features described in the formation of the source contact 220, and removal of the source contact material 220' within the slit 270 as shown in FIGS. 17 and 18 are substantially similar to the methods and features described above for FIGS. 7 and 8.

Figure 19:
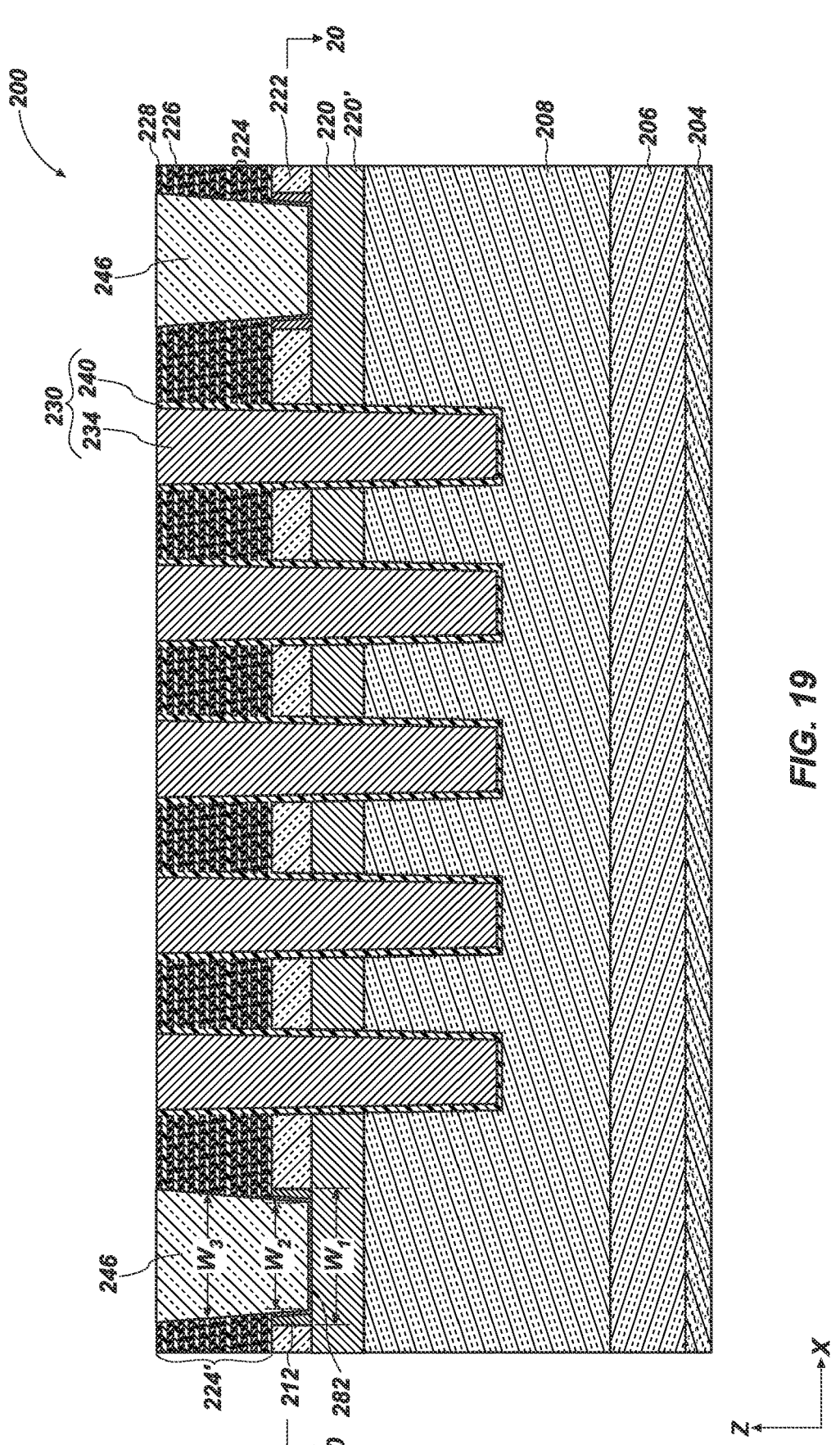
FIG. 19 is a cross-sectional, elevational, schematic illustration of the electronic device in accordance with embodiments of the disclosure formed by the process of FIGS. 11-18.
Figure 20:
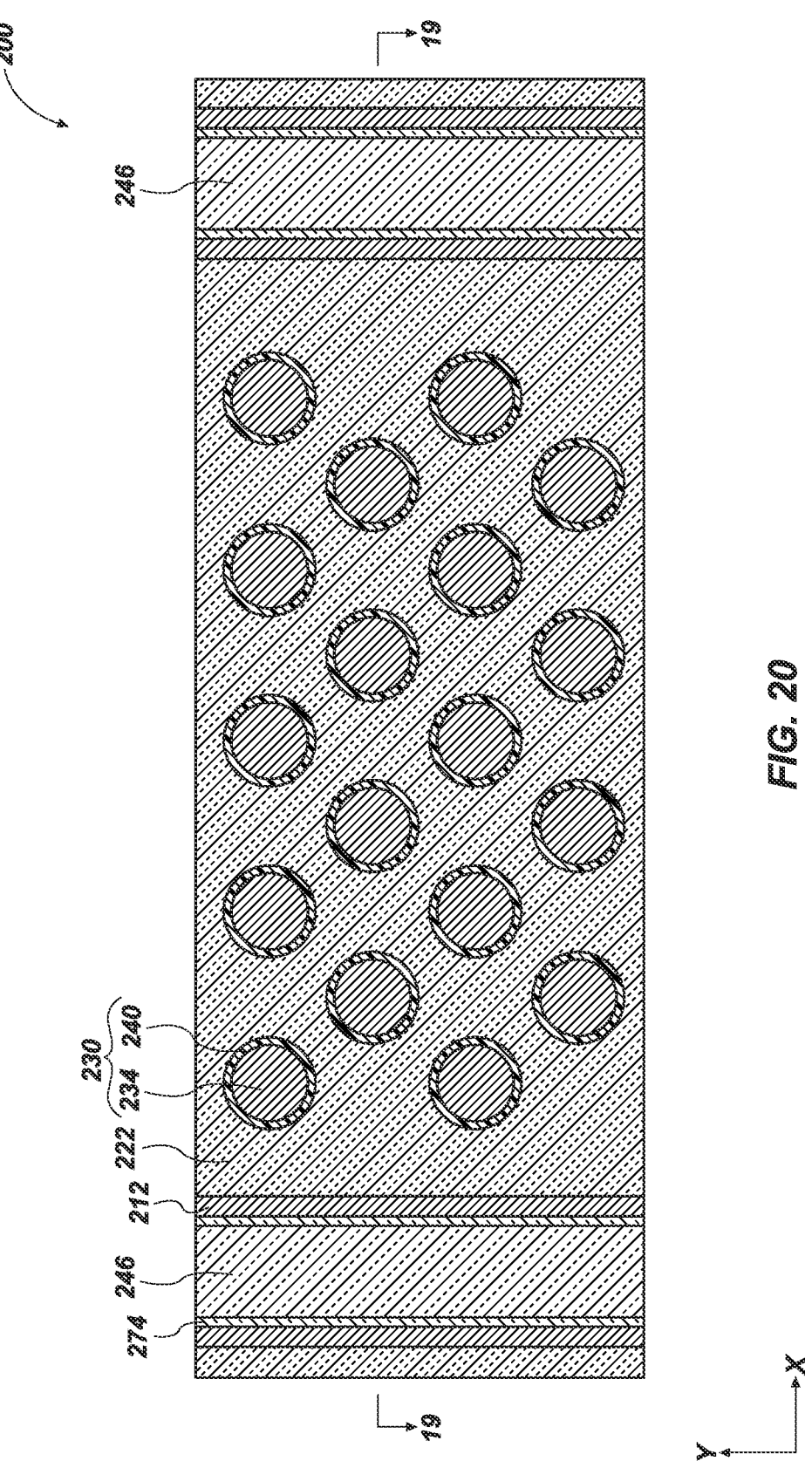
FIG. 20 is a simplified partial top-down view of the electronic device of FIG. 19.

Subsequent acts are then conducted to form the electronic device 200 as shown in FIGS. 19 and 20. These subsequent acts are substantially similar to those described above for the electronic device 100, shown in FIGS. 9 and 10. Thus, the electronic device 200 may be formed with the oxide fill region 212 above the source contact 220. The second fill material 246 may laterally interpose a portion of the oxide fill region 212 from another portion of the oxide fill region 212. An upper portion of the semiconductive material 208 may be continuous below the second fill material 246.

During formation of the electronic device 200 according to embodiments of the disclosure, the oxide fill region 212 provides corrosion protection to the source stack 202. This protection allows for the source contact 220 to contact the conductive materials 228, while mitigating corrosion of the source material 206, through which the source contact 220 may electrically short to the source material 206. The electron flow through conductive and semiconductive materials of the pillar 230 is also improved. In addition, by eliminating the cell films (the tunnel dielectric material, the charge trap material, and the charge blocking material 240) in a conductive path between the channel and the SGS, sources of charge trap within the conductive path are reduced or eliminated. The use of the oxide fill region 212 also provides a process margin during the fabrication of the electronic device 200. The oxide fill region 212 positioned above the source contact 220 allows for the partial removal of the oxide fill region 212, and allows for the upper portion of the semiconductive material 208 to be continuous below the second fill material 246. Therefore, electrical control of the electronic device 200 according to embodiments of the disclosure is improved relative to that of conventional electronic devices having a doped semiconductive material in a similar location, where interactions between a channel and memory cells of the conventional electronic devices occur.

Accordingly, disclosed is an electronic device comprising a source stack comprising one or more conductive materials. An oxide fill region is within an upper portion of the source stack. A source contact is adjacent to the source stack and oxide fill region, and a doped semiconductive material is adjacent to the source contact. Tiers of alternating conductive materials and dielectric materials are adjacent to the doped semiconductive material, and pillars extend through the tiers, the doped semiconductive material, and the source contact, and into the source stack.

Accordingly, disclosed is an electronic device comprising an oxide fill region in a source stack comprising one or more conductive materials. A source contact is adjacent to the source stack and a doped semiconductive material is adjacent to the source contact. Tiers of alternating conductive materials and dielectric materials are adjacent to the doped semiconductive material. Pillars extend through the tiers of alternating conductive materials and dielectric materials and into the source stack. A fill material is laterally adjacent to the pillars and extends through the tiers of alternating conductive materials and dielectric materials and the doped semiconductive material. The fill material is vertically adjacent to the source contact and exhibits a smaller width in a lateral direction than a width in the lateral direction of the oxide fill region.

Accordingly, disclosed is a method of forming an electronic device that comprises forming a source contact sacrificial structure adjacent to a source stack. An oxide fill region is formed adjacent to the source contact sacrificial structure, and a slit sacrificial structure is formed vertically neighboring the oxide fill region. A doped semiconductive material is formed adjacent to the source contact sacrificial structure. Tiers are formed adjacent to the doped semiconductive material, the tiers comprising alternating dielectric materials and nitride materials. Pillars are formed through the tiers, the doped semiconductive material, the source contact sacrificial structure, and the source stack, and the pillars include a channel, a charge blocking material, and a charge trap material. A slit is formed vertically adjacent to the slit sacrificial structure through the tiers to expose the source contact sacrificial structure. At least a portion of the slit sacrificial structure and the source contact sacrificial structure is removed to form a source contact opening. A source contact is formed in the source contact opening and in a portion of the slit. At least a portion of the source contact in the slit is removed. A liner is formed on an upper surface of the source contact. The nitride materials in the tiers are replaced with conductive materials and a fill material is formed in the slit, a portion of the fill material neighboring the oxide fill region.

Figure 21:
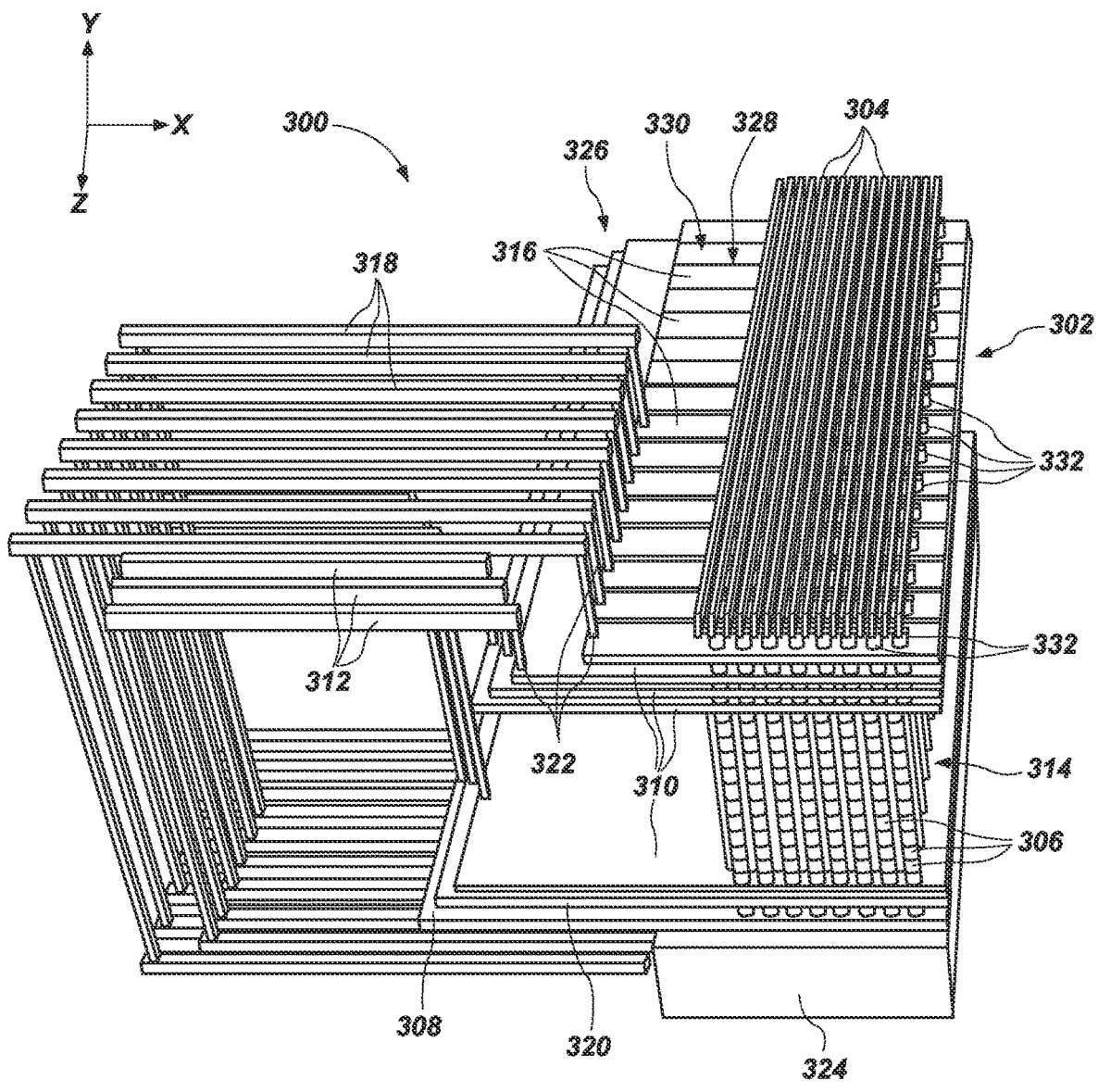
FIG. 21 is a partial, cutaway, perspective, schematic illustration of an apparatus including one or more electronic devices in accordance with embodiments of the disclosure.

With reference to FIG. 21 illustrated is a partial cutaway, perspective, schematic illustration of a portion of an appa-ratus 300 (e.g., a memory device) including an electronic device 302 according to embodiments of the disclosure. The electronic device 302 may be substantially similar to the embodiments of the electronic device described above (e.g., the electronic device 100, 200 of FIGS. 9, 10, 19, and 20) and may have been formed by the methods described above. By way of example only, the memory device may be a 3D NAND Flash memory device, such as a multideck 3D NAND Flash memory device. As illustrated in FIG. 21, the electronic device 302 may include a staircase structure 326 defining contact regions for connecting access lines (e.g., word lines) 312 to conductive tiers 310 (e.g., conductive regions, conductive materials of tiers). The electronic device 302 may include pillars 130, 230 (see FIGS. 9 and 19) with strings 314 (e.g., strings of memory cells) that are coupled to each other in series. The pillars 130, 230 with the strings 314 may extend at least somewhat vertically (e.g., in the Z-direction) and orthogonally relative to the conductive tiers 310, relative to data lines 304, relative to a source tier 308 (e.g., within one or more base materials under the source stack 102 (see FIG. 9)), relative to the access lines 312, relative to first select gates 316 (e.g., upper select gates, drain select gates (SGDs)), relative to select lines 318, and/or relative to second select gates 320 (e.g., SGS). The first select gates 316 may be horizontally divided (e.g., in the X-direction) into multiple blocks 330 by slits 328.

Vertical conductive contacts 322 may electrically couple components to each other, as illustrated. For example, the select lines 318 may be electrically coupled to the first select gates 316, and the access lines 312 may be electrically coupled to the conductive tiers 310. The apparatus 300 may also include a control unit 324 positioned under the memory array, which may include at least one of string driver circuitry, pass gates, circuitry for selecting gates, circuitry for selecting conductive lines (e.g., the data lines 304, the access lines 312), circuitry for amplifying signals, and circuitry for sensing signals. The control unit 324 may be electrically coupled to the data lines 304, the source tier 308, the access lines 312, the first select gates 316, and/or the second select gates 320, for example. In some embodiments, the control unit 324 includes CMOS (complementary metal-oxide-semiconductor) circuitry. In such embodiments, the control unit 324 may be characterized as having a so-called "CMOS under Array" (CuA) configuration.

The first select gates 316 may extend horizontally in a first direction (e.g., the Y-direction) and may be coupled to respective first groups of strings 314 of memory cells 306 at a first end (e.g., an upper end) of the strings 314. The second select gate 320 may be formed in a substantially planar configuration and may be coupled to the strings 314 at a second, opposite end (e.g., a lower end) of the strings 314 of memory cells 306.

The data lines 304 (e.g., bit lines) may extend horizontally in a second direction (e.g., in the X-direction) that is at an angle (e.g., perpendicular) to the first direction in which the first select gates 316 extend. The data lines 304 may be coupled to respective second groups of the strings 314 at the first end (e.g., the upper end) of the strings 314. A first group of strings 314 coupled to a respective first select gate 316 may share a particular string 314 with a second group of strings 314 coupled to a respective data line 304. Thus, a particular string 314 may be selected at an intersection of a particular first select gate 316 and a particular data line 304. Accordingly, the first select gates 316 may be used for selecting memory cells 306 of the strings 314 of memory cells 306.

The conductive tiers 310 (e.g., word lines, conductive liner materials 104 (e.g., FIG. 9)) may extend in respective horizontal planes. The conductive tiers 310 may be stacked vertically, such that each conductive tier 310 is coupled to all of the strings 314 of memory cells 306, and the strings 314 of the memory cells 306 extend vertically through the stack of conductive tiers 310. The conductive tiers 310 may be coupled to or may function as control gates of the memory cells 306 to which the conductive tiers 310 are coupled. Each conductive tier 310 may be coupled to one memory cell 306 of a particular string 314 of memory cells 306. The first select gates 316 and the second select gates 320 may operate to select a particular string 314 of the memory cells 306 between a particular data line 304 and the source tier 308. Thus, a particular memory cell 306 may be selected and electrically coupled to a data line 304 by operation of (e.g., by selecting) the appropriate first select gate 316, second select gate 320, and conductive tier 310 that are coupled to the particular memory cell 306.

The staircase structure 326 may be configured to provide electrical connection between the access lines 312 and the conductive materials of the tiers 310 through the vertical conductive contacts 322. In other words, a particular level of the conductive tiers 310 may be selected via one of the access lines 312 that is in electrical communication with a respective one of the vertical conductive contacts 322 in electrical communication with the particular conductive tier 310. The data lines 304 may be electrically coupled to the strings 314 through conductive structures 332 (e.g., conductive contacts).

Figure 22:
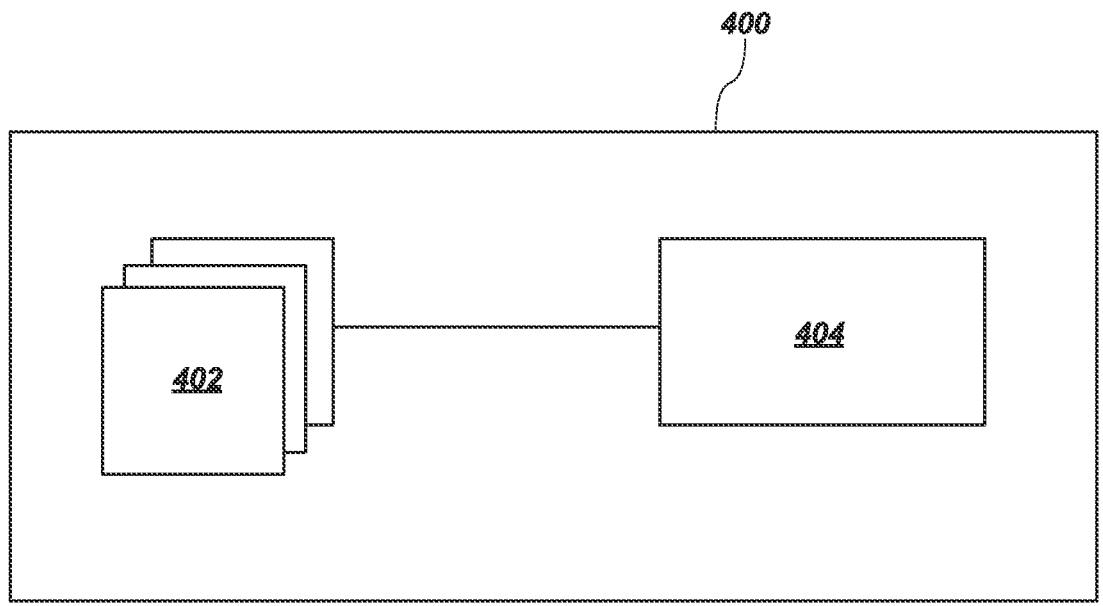
FIG. 22 is a block diagram of an electronic system including one or more electronic devices in accordance with embodiments of the disclosure.

The apparatus 300 including the electronic devices 100, 200 may be used in embodiments of electronic systems of the disclosure. FIG. 22 is a block diagram of an electronic system 400, in accordance with embodiments of the disclosure. The electronic system 400 includes, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 400 includes at least one memory device 402 that includes, for example, one or more electronic devices 100, 200. The electronic system 400 may further include at least one electronic signal processor device 404 (e.g., a micro-processor). The at least one electronic signal processor device 404 may, optionally, include one or more electronic devices 100, 200.

Accordingly, disclosed is an electronic system comprising an input device, an output device, a processor device oper-ably coupled to the input device and to the output device, and one or more memory devices operably coupled to the processor device. The one or more memory devices com-prises a source contact adjacent to a source stack, an oxide fill region within an upper portion of the source stack, a semiconductive material adjacent to the source contact, tiers of alternating conductive materials and dielectric materials adjacent to the semiconductive material, and memory pillars extending through the tiers of alternating conductive mate-rials and dielectric materials, the semiconductive material, the source contact, and partially into the source stack.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:

a source stack comprising one or more conductive materials;

an oxide fill region within an upper portion of the source stack;

a source contact adjacent to the source stack and the oxide fill region;

a doped semiconductive material adjacent to the source contact;

a fill material vertically adjacent to the oxide fill region and the source contact;

tiers of alternating conductive materials and dielectric materials adjacent to the doped semiconductive material; and pillars extending through the tiers of alternating conductive materials and dielectric materials, the doped semiconductive material, and the source contact and into the source stack.

2. The electronic device of claim 1, further comprising a source contact liner between the fill material and the source contact.

3. The electronic device of claim 2, wherein the source contact liner is between the doped semiconductive material and the fill material.

4. The electronic device of claim 3, wherein the source contact liner is laterally interposed between the fill material and the doped semiconductive material, and the source contact liner is vertically interposed between the fill material and the source contact.

5. The electronic device of claim 1, wherein a width of the oxide fill region is wider in a lateral direction than a width of the fill material laterally adjacent to the doped semiconductive material.

6. The electronic device of claim 1, wherein a width of a portion of the fill material laterally adjacent to the doped semiconductive material is substantially the same as a width of a portion of the fill material laterally adjacent to a bottom of the tiers of alternating conductive materials and dielectric materials.

7. The electronic device of claim 1, wherein a top surface of the oxide fill region is substantially coplanar with an upper portion of the source stack.

8. The electronic device of claim 1, wherein the source contact is below the doped semiconductive material and extends laterally to a channel of the pillars.

9. The electronic device of claim 1, wherein the oxide fill region comprises a silicon oxide material.

10. An electronic device, comprising:

an oxide fill region in a source stack comprising one or more conductive materials;

a source contact adjacent to the source stack;

a doped semiconductive material adjacent to the source contact;

tiers of alternating conductive materials and dielectric materials adjacent to the doped semiconductive material;

pillars extending through the tiers of alternating conductive materials and dielectric materials and into the source stack; and a fill material laterally adjacent to the pillars and extending through the tiers of alternating conductive materials and dielectric materials and the doped semiconductive material, the fill material vertically adjacent to the source contact and exhibiting a smaller width in a lateral direction than a width in the lateral direction of the oxide fill region.

11. An electronic system, comprising:

an input device;

an output device;

a processor device operably coupled to the input device and to the output device; and one or more memory devices operably coupled to the processor device, the one or more memory devices comprising:

a source contact adjacent to a source stack;

an oxide fill region within an upper portion of the source stack;

a semiconductive material adjacent to the source contact;

tiers of alternating conductive materials and dielectric materials adjacent to the semiconductive material;

memory pillars extending through the tiers of alternating conductive materials and dielectric materials, the semiconductive material, the source contact, and partially into the source stack; and a fill material extending through the tiers of alternating conductive materials and dielectric materials and overlying the oxide fill region and a portion of the source contact.

12. The electronic system of claim 11, further comprising a liner interposed between the fill material and the dielectric materials, and between the fill material and the source contact.

13. The electronic system of claim 11, wherein portions of the oxide fill region are laterally adjacent to the dielectric materials and the fill material.

14. A method of forming an electronic device, the method comprising:

forming a source contact sacrificial structure adjacent to a source stack;

forming an oxide fill region adjacent to the source contact sacrificial structure;

forming a slit sacrificial structure vertically neighboring the oxide fill region;

forming a doped semiconductive material adjacent to the source contact sacrificial structure;

forming tiers adjacent to the doped semiconductive material, the tiers comprising alternating dielectric materials and nitride materials;

forming pillars through the tiers, the doped semiconductive material, the source contact sacrificial structure, and the source stack, the pillars including a channel, a charge blocking material, and a charge trap material;

forming a slit vertically adjacent to the slit sacrificial structure through the tiers to expose the source contact sacrificial structure;

removing at least a portion of the slit sacrificial structure and the source contact sacrificial structure to form a source contact opening;

forming a source contact in the source contact opening and in a portion of the slit;

removing at least a portion of the source contact in the slit;

forming a liner on an upper surface of the source contact;

replacing the nitride materials in the tiers with conductive materials; and forming a fill material in the slit, a portion of the fill material neighboring the oxide fill region.

15. The method of claim 14, wherein forming an oxide fill region adjacent to the source contact sacrificial structure comprises forming the oxide fill region within the source stack.

16. The method of claim 14, wherein forming an oxide fill region adjacent to the source contact sacrificial structure comprises forming the oxide fill region over the source contact sacrificial structure.

17. The method of claim 16, wherein forming the oxide fill region over the source contact sacrificial structure comprises forming the oxide fill region within the doped semiconductive material.

18. The method of claim 14, wherein forming a slit sacrificial structure vertically neighboring the oxide fill region comprises forming the slit sacrificial structure above the oxide fill region.

19. The method of claim 14, wherein removing at least a portion of the slit sacrificial structure and the source contact sacrificial structure to form a source contact opening comprises substantially completely removing the slit sacrificial structure and the source contact sacrificial structure to form the source contact opening.

20. The method of claim 14, wherein forming a slit sacrificial structure vertically neighboring the oxide fill region comprises forming the slit sacrificial structure below the oxide fill region.

21. The method of claim 14, wherein removing at least a portion of the slit sacrificial structure and the source contact sacrificial structure to form a source contact opening comprises partially removing the oxide fill region, substantially completely removing the slit sacrificial structure, and substantially completely removing the source contact sacrificial structure to form the source contact opening.

22. The method of claim 14, wherein forming a fill material in the slit comprises filling the slit with the fill material, the fill material proximal to the source contact exhibiting a narrower width than a width of the oxide fill region.

* * * * *